US012154852B2

(12) United States Patent
Hsu et al.

(10) Patent No.: US 12,154,852 B2
(45) Date of Patent: Nov. 26, 2024

(54) INTERCONNECTION STRUCTURE AND MANUFACTURING METHOD THEREOF

(71) Applicant: UNITED MICROELECTRONICS CORP., Hsin-Chu (TW)

(72) Inventors: Min-Shiang Hsu, Kaohsiung (TW); Yu-Han Tsai, Kaohsiung (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 405 days.

(21) Appl. No.: 17/670,520

(22) Filed: Feb. 14, 2022

(65) Prior Publication Data

US 2023/0215801 A1 Jul. 6, 2023

(30) Foreign Application Priority Data

Jan. 3, 2022 (TW) .................................. 111100119

(51) Int. Cl.
*H01L 23/522* (2006.01)
*H01L 21/768* (2006.01)

(52) U.S. Cl.
CPC .... *H01L 23/5226* (2013.01); *H01L 21/76816* (2013.01); *H01L 21/76832* (2013.01); *H01L 21/7684* (2013.01); *H01L 21/76877* (2013.01); *H01L 21/76897* (2013.01)

(58) Field of Classification Search
CPC ........... H01L 21/76816; H01L 21/7681; H01L 21/76829; H01L 21/76897
See application file for complete search history.

(56) References Cited

U.S. PATENT DOCUMENTS

| | | | |
|---|---|---|---|
| 6,339,027 B1 * | 1/2002 | Chok | H01L 21/76897 257/E21.507 |
| 6,350,672 B1 | 2/2002 | Sun | |
| 8,486,587 B2 | 7/2013 | Tsai | |
| 8,836,129 B1 | 9/2014 | Hung | |
| 9,006,804 B2 | 4/2015 | Hung | |
| 9,184,254 B2 | 11/2015 | Lo | |

(Continued)

OTHER PUBLICATIONS

Hsu, the specification, including the claims, and drawings in the U.S. Appl. No. 17/168,099, filed Feb. 4, 2021.

(Continued)

*Primary Examiner* — David A Zarneke
(74) *Attorney, Agent, or Firm* — Winston Hsu

(57) ABSTRACT

An interconnection structure includes a first interconnection level, a second interconnection level, a third interconnection level, and a super via structure. The second interconnection level is disposed on the first interconnection level, and the third interconnection level is disposed on the second interconnection level. The second interconnection level includes a second conductive layer and a block layer disposed in a dielectric layer. A bottom surface of the block layer is lower than a top surface of the second conductive layer in a vertical direction. The block layer is disposed between a first conductive layer of the first interconnection level and a third conductive layer of the third interconnection level in the vertical direction. The super via structure penetrates through the block layer and the second interconnection level in the vertical direction and electrically connects the first conductive layer and the third conductive layer.

9 Claims, 22 Drawing Sheets

(56) References Cited

U.S. PATENT DOCUMENTS

| | | | |
|---|---|---|---|
| 9,275,933 | B2 | 3/2016 | Kuo |
| 9,279,923 | B2 | 3/2016 | Yu |
| 9,373,543 | B1* | 6/2016 | Mont ............... H01L 21/76816 |
| 9,439,812 | B2 | 9/2016 | Komatsubara |
| 9,646,876 | B2 | 5/2017 | Padhi |
| 9,748,139 | B1 | 8/2017 | Liou |
| 9,761,791 | B2 | 9/2017 | Shiu |
| 10,020,254 | B1 | 7/2018 | Bao |
| 10,026,687 | B1* | 7/2018 | Lin ................... H01L 23/53295 |
| 10,083,905 | B2* | 9/2018 | Briggs ............. H01L 21/76813 |
| 10,090,465 | B2 | 10/2018 | Hsu |
| 10,204,826 | B1 | 2/2019 | Hsu |
| 10,461,027 | B2* | 10/2019 | Lee ................... H01L 23/53238 |
| 10,600,732 | B1 | 3/2020 | Hsu |
| 11,127,675 | B2 | 9/2021 | Hsu |
| 2023/0187278 | A1* | 6/2023 | Park .................... H01L 23/5226 257/572 |

OTHER PUBLICATIONS

Murdoch, Feasibility Study of Fully Self Aligned Vias for 5nm Node BEOL, 2017 IEEE International Interconnect Technology Conference (IITC), May 16, 2017.

Gupta, Integration scheme and 3D RC extractions of three-level supervia at 16nm half pitch, Microelectronic Engineering vol. 191, May 5, 2018, pp. 20-24, Jan. 31, 2018.

Ren, Physical Vapor Deposited AIN as Scalable and Reliable Interconnect Etch-Stop ≤ 10nm Node, 2016 IEEE International Interconnect Technology Conference / Advanced Metallization Conference (IITC/AMC), May 23, 2016.

Vega-Gonzalez, Process Integration of High Aspect Ratio Vias with a Comparison between Co and Ru Metallizations, 2021 IEEE International Interconnect Technology Conference(IITC), Jul. 6, 2021.

Vega-Gonzalez, Supervia Process Integration and Reliability Compared to Stacked Vias Using Barrierless Ruthenium, 2020 IEEE International Electron Devices Meeting (IEDM), Dec. 12, 2020.

Vega-Gonzalez, Three-Layer BEOL Process Integration with Supervia and Self-Aligned-Block Options for the 3 nm Node, 2019 IEEE International Electron Devices Meeting (IEDM), Dec. 7, 2019.

Tokei, The SuperVia: a promising scaling booster for the (sub-)3nm technology node, https://www.imec-int.com/en/imec-magazine/imec-magazine-november-2018/the-supervia-a-promising-scaling-booster-for-the-sub-3nm-technology-node, Nov. 2, 2018.

Singer, Scaling the BEOL: A Toolbox Filled with New Processes, Boosters and Conductors, https://www.semiconductor-digest.com/scaling-the-beol-a-toolbox-filled-with-new-processes-boosters-and-conductors/, Feb. 8, 2020.

* cited by examiner

INTERCONNECTION STRUCTURE AND MANUFACTURING METHOD THEREOF

BACKGROUND OF THE INVENTION

1. Field of the Invention

The present invention relates to an interconnection structure and a manufacturing method thereof, and more particularly, to an interconnection structure including a super via structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. In the interconnection structure of the integrated circuit, the alignment accuracy requirements for forming connection plugs connecting different metal layers are becoming more and more stringent while the line width of each metal layer and the spacing between the metal layers become smaller, and the manufacturing yield and the process design of the product are influenced accordingly. Therefore, it is necessary to modify the process and/or the structural design for improving related process window, manufacturing yield, and/or product reliability.

SUMMARY OF THE INVENTION

An interconnection device and a manufacturing method thereof are provided in the present invention. A block layer is disposed in a second interconnection level, and a super via structure configured to connect a first conductive layer in a first interconnection level and a third conductive layer in a third interconnection level penetrates through the block layer and the second interconnection level. The block layer may be used to improve negative influence of alignment deviations in a process of forming the super via structure, and related process window, manufacturing yield, and/or reliability of the super via structure and the interconnection structure may be improved accordingly.

According to an embodiment of the present invention, an interconnection structure is provided. The interconnection structure includes a first interconnection level, a second interconnection level, a third interconnection level, and a first super via structure. The first interconnection level includes a first dielectric layer and at least one first conductive layer, and the first conductive layer is disposed in the first dielectric layer. The second interconnection level is disposed on the first interconnection level, and the second interconnection level includes a second dielectric layer and at least one second conductive layer, and at least one first block layer. The second conductive layer and the first block layer are disposed in the second dielectric layer, and a bottom surface of the first block layer is lower than a top surface of the second conductive layer in a vertical direction. The third interconnection level is disposed on the second interconnection level, the third interconnection level includes a third dielectric layer and at least one third conductive layer, and the third conductive layer is disposed in the third dielectric layer. The first block layer is disposed between the third conductive layer and the first conductive layer in the vertical direction. The first super via structure penetrates through the first block layer and the second interconnection level in the vertical direction and electrically connects the first conductive layer and the third conductive layer.

According to an embodiment of the present invention, a manufacturing method of an interconnection structure is provided. The manufacturing method includes the following steps. A second interconnection level is formed on a first interconnection level. The first interconnection level includes a first dielectric layer and at least one first conductive layer, and the first conductive layer is disposed in the first dielectric layer. The second interconnection level includes a second dielectric layer, at least one second conductive layer, and at least one block layer. The second conductive layer and the block layer are disposed in the second dielectric layer. A bottom surface of the block layer is lower than a top surface of the second conductive layer in a vertical direction. A third interconnection level and a super via structure are then formed. The third interconnection level is formed on the second interconnection level, the third interconnection level includes a third dielectric layer and at least one third conductive layer, and the third conductive layer is disposed in the third dielectric layer. The block layer is disposed between the third conductive layer and the first conductive layer in the vertical direction, and the super via structure penetrates through the block layer and the second interconnection level in the vertical direction and electrically connects the first conductive layer and the third conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-18 are schematic drawings illustrating a manufacturing method of the interconnection structure according to the first embodiment of the present invention, wherein FIG. 5 is a schematic drawing in a step subsequent to FIG. 4, FIG. 6 is a cross-sectional diagram taken along a line A2-A2' in FIG. 5, FIG. 7 is a schematic drawing in a step subsequent to FIG. 5, FIG. 8 is a cross-sectional diagram taken along a line A3-A3' in FIG. 7, FIG. 9 is a cross-sectional diagram taken along a line B3-B3' in FIG. 7, FIG. 10 is a schematic drawing in a step subsequent to FIG. 7, FIG. 11 is a cross-sectional diagram taken along a line A4-A4' in FIG. 10, FIG. 12 is a cross-sectional diagram taken along a line B4-B4' in FIG. 10, FIG. 13 is a schematic drawing in a step subsequent to FIG. 10, FIG. 14 is a cross-sectional diagram taken along a line A5-A5' in FIG. 13, FIG. 15 is a cross-sectional diagram taken along a line B5-B5' in FIG. 13, FIG. 16 is a schematic drawing in a step subsequent to FIG. 14, FIG. 17 is a schematic drawing in a step subsequent to FIG. 16, and FIG. 18 is a schematic drawing in a step subsequent to FIG. 17.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
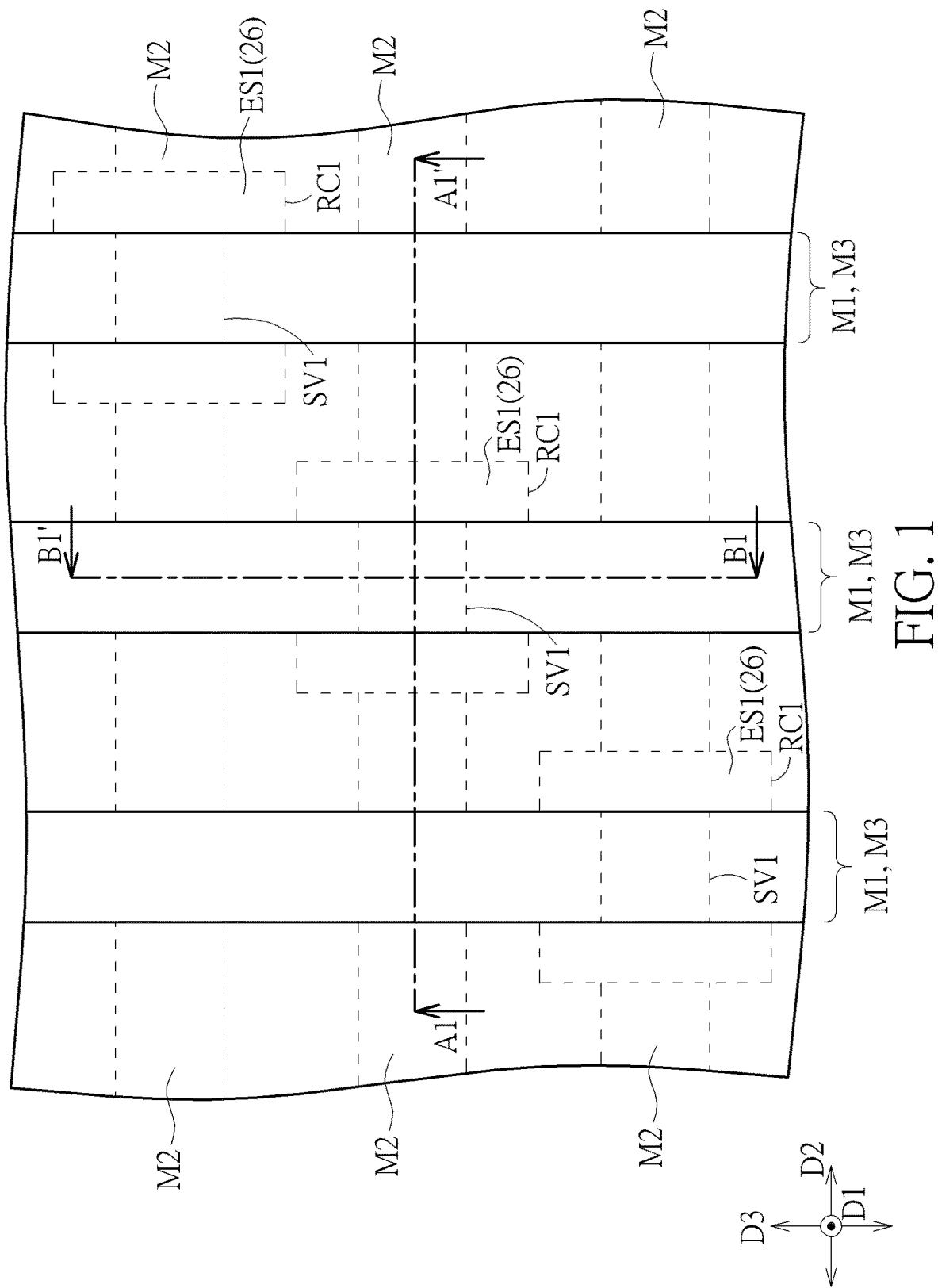
FIG. 1 is a schematic drawing illustrating a top view of an interconnection structure according to a first embodiment of the present invention.
Figure 2:
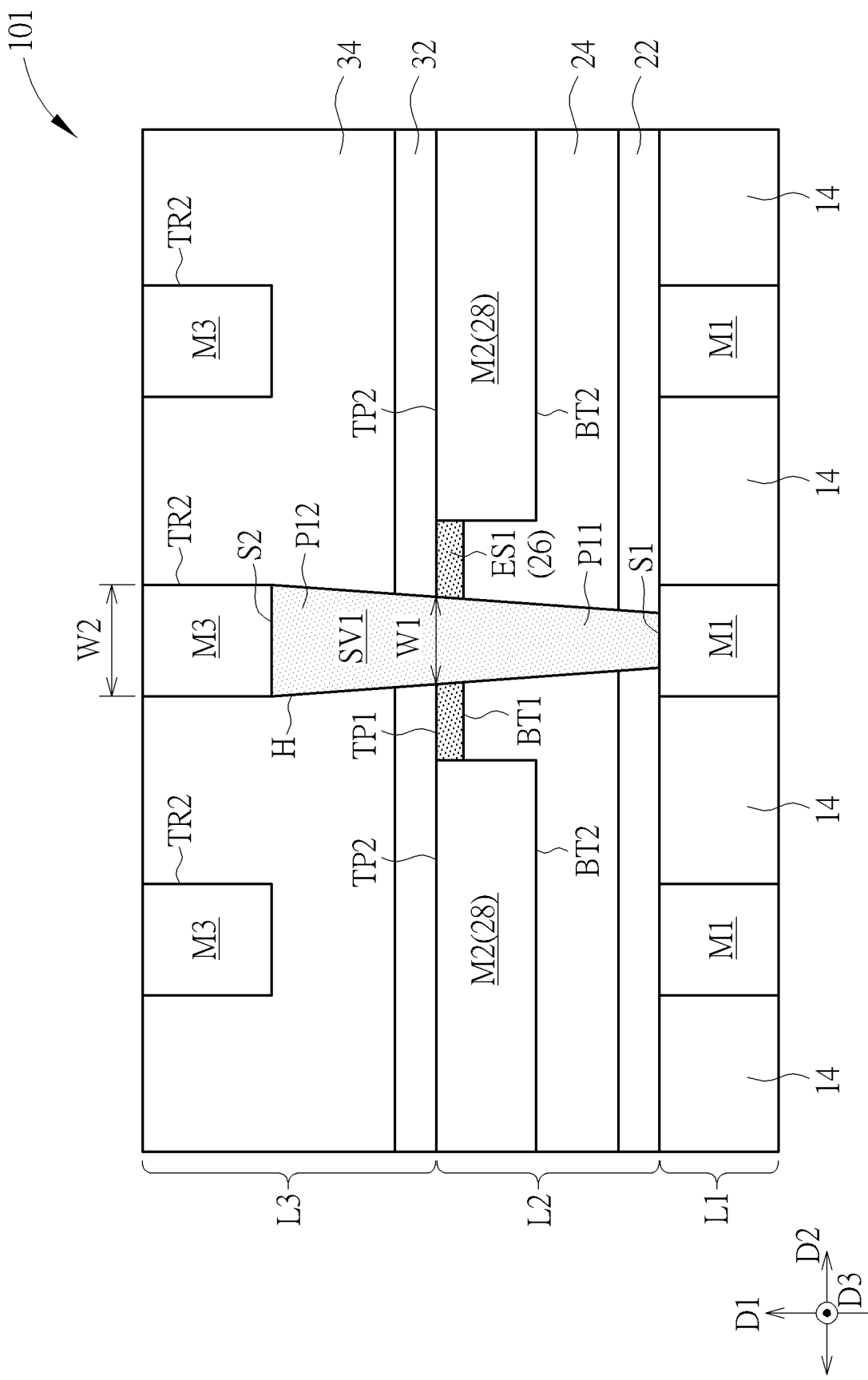
FIG. 2 is a cross-sectional diagram taken along a line A1-A1' in FIG. 1.
Figure 3:
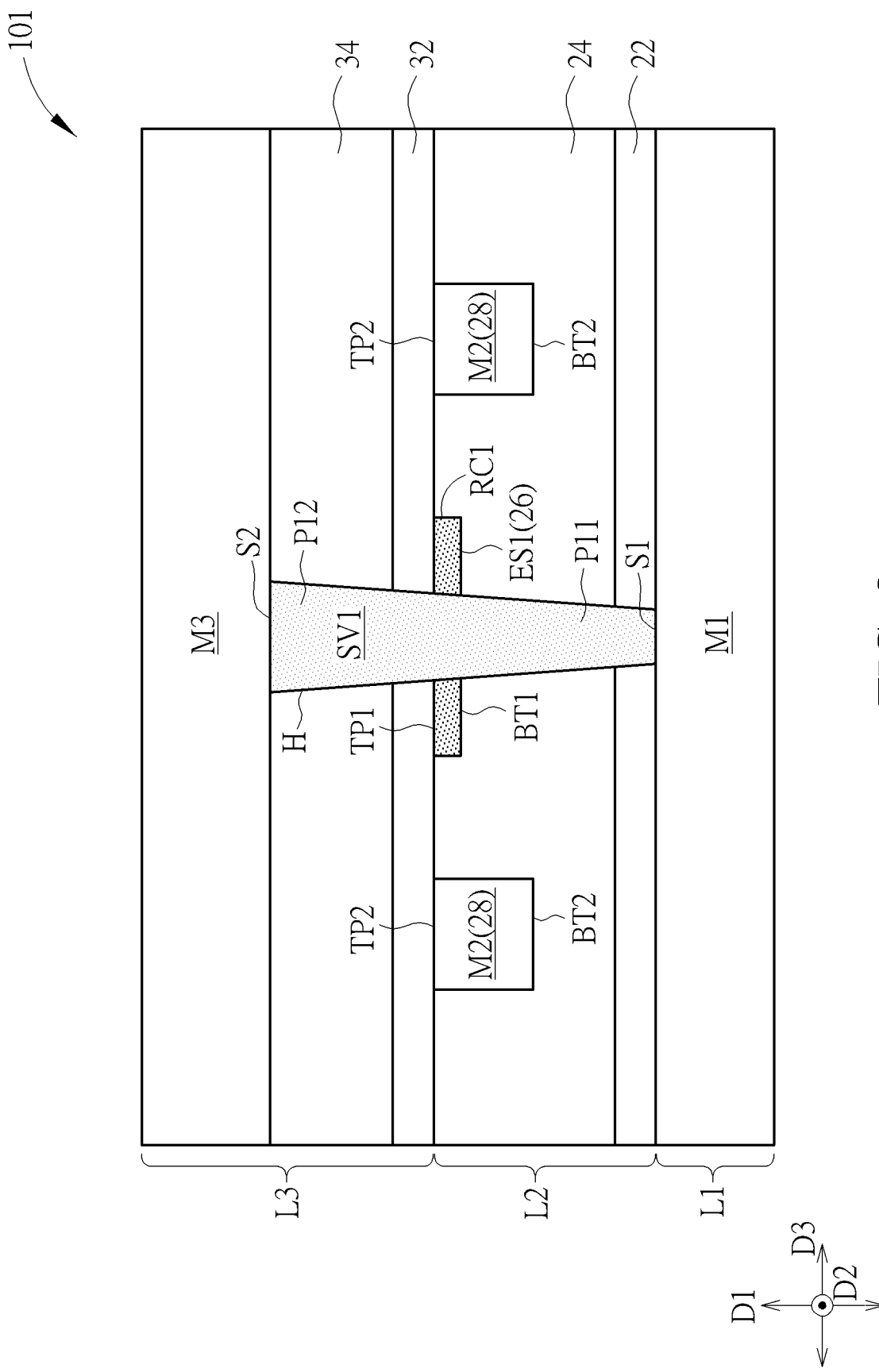
FIG. 3 is a cross-sectional diagram taken along a line B1-B1' in FIG. 1.

Please refer to FIGS. 1-3. FIG. 1 is a schematic drawing illustrating a top view of an interconnection structure 101 according to a first embodiment of the present invention, FIG. 2 is a cross-sectional diagram taken along a line A1-A1' in FIG. 1, and FIG. 3 is a cross-sectional diagram taken along a line B1-B1' in FIG. 1. As shown in FIGS. 1-3, the interconnection structure 101 includes a first interconnection level L1, a second interconnection level L2, a third interconnection level L3, and a super via structure SV1. The first interconnection level L1 includes a dielectric layer 14 and at least one first conductive layer M1, and the first conductive layer M1 is disposed in the dielectric layer 14. The second interconnection level L2 is disposed on the first interconnection level L1, and the second interconnection level L2 includes a dielectric layer 24 and at least one second conductive layer M2, and at least one block layer ES1. The second conductive layer M2 and the block layer ES1 are disposed in the dielectric layer 24, and a bottom surface BT1 of the block layer ES1 is lower than a top surface TP2 of the second conductive layer M2 in a vertical direction (such as a first direction D1). The third interconnection level L3 is disposed on the second interconnection level L2, the third interconnection level L3 includes a dielectric layer 34 and at least one third conductive layer M3, and the third conductive layer M3 is disposed in the dielectric layer 34. The block layer ES1 is disposed between the third conductive layer M3 and the first conductive layer M1 in the first direction D1.

The super via structure SV1 penetrates through the block layer ES1 and the second interconnection level L2 in the first direction D1 and electrically connects the first conductive layer M1 and the third conductive layer M3. The super via structure SV1 may be used to directly connect the first conductive layer M1 in the first interconnection level L1 and the third conductive layer M3 in the third interconnection level L3 electrically, and design flexibility of related circuits may be enhanced and/or design requirements of special circuit layouts may be satisfied accordingly. In addition, problems of short between the super via structure SV1 and the second conductive layer M2 generated by process deviations may be improved by disposing the block layer ES1, and the reliability of the super via structure SV1 and/or the interconnection structure 101 may be enhanced by the material characteristics of the block layer ES1. For example, the time dependent dielectric breakdown (TDDB) between the super via structure SV1 and other conductive layers may be improved accordingly, but not limited thereto.

In some embodiments, the first interconnection level L1 may be disposed on a substrate (not illustrated), and the substrate may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. In some embodiments, according to some design considerations, a plurality of semiconductor structures (such as field effect transistors, not illustrated) may be formed on the semiconductor substrate and a dielectric layer covering the semiconductor structures (such as the dielectric layer 14 or another dielectric layer under the dielectric layer 14) may be formed before the step of forming the interconnection structure, but not limited thereto. In some embodiments, the semiconductor structures on the substrate may be electrically connected to other circuits upwards via the interconnection structure and/or electrically connected to other components disposed within the interconnection structure (such as capacitor structures, transistor structures, and/or memory cells disposed within the interconnection structure, but not limited thereto) via the interconnection structure. In some embodiments, the conductive layers in the interconnection levels may be a portion of a semiconductor unit (such as a source/drain of a transistor structure), and the super via structure SV1 may also be used to electrically connect the semiconductor unit disposed in the interconnection structure with a conductive layer in other level.

In some embodiments, the vertical direction (such as the first direction D1 described above) may be regarded as a thickness direction of the substrate and/or a thickness direction of each interconnection level, and horizontal directions (such as a second direction D2 and/or a third direction D3) may be orthogonal to the first direction D1. In this description, a distance between a bottom surface of the first interconnection level L1 (such as a surface of the first interconnection level L1 away from the second interconnection level L2) and a relatively higher location and/or a relatively higher part in the first direction D1 may be greater than a distance between the bottom surface of the first interconnection level L1 and a relatively lower location and/or a relatively lower part in the first direction D1. The bottom or a lower portion of each component may be closer to the bottom surface of the first interconnection level L1 in the first direction D1 than the top or upper portion of this component. Another component disposed above a specific component may be regarded as being relatively far from the bottom surface of the first interconnection level L1 in the first direction D1, and another component disposed under a specific component may be regarded as being relatively closer to the bottom surface of the first interconnection level L1 in the first direction D1. Additionally, in this description, a top surface of a specific object may include the topmost surface of the specific object in the first direction D1, and a bottom surface of a specific object may include the bottommost surface of the specific object in the first direction D1, but not limited thereto.

In some embodiments, the conductive layer in each interconnection level (such as the first conductive layer M1, the second conductive layer M2, and the third conductive layer M3) may be regarded as a trench conductor disposed in the dielectric layer and elongated in the horizontal direction (such as the second direction D2 or the third direction D3). Therefore, a portion of the dielectric layer 24 may be located between the second conductive layer M2 and the first interconnection level L1 in the first direction D1, and a portion of the dielectric layer 34 may be located between the third conductive layer M3 and the second interconnection level L3 in the first direction D1. In some embodiments, the first interconnection level L1 may include a plurality of the first conductive layers M1 disposed in the dielectric layer 14, the second interconnection level L2 may include a plurality of the second conductive layers M2 disposed in the dielectric layer, and the third interconnection level L3 may include a plurality of the third conductive layers M3 disposed in the dielectric layer 34. Each of the first conductive layers M1 may be elongated in the third direction D3 and the first conductive layers M1 may be arranged repeatedly in the second direction D2; Each of the third conductive layers M3 may be elongated in the third direction D3 and the third conductive layers M3 may be arranged repeatedly in the second direction D2; and each of the second conductive layers M2 may be elongated in the second direction D2 and at least some of the second conductive layers M2 may be arranged repeatedly in the third direction D3, but not limited thereto. In some embodiments, some of the second conductive layers M2 may be arranged repeatedly in the second direction D2 and located at two opposite sides of the block layer ES1 in the second direction D2 and directly connected with the block layer ES1. In other words, at least two of the second conductive layers M2 may be disposed adjacent to each other in the second direction D2, the block layer ES1 may be disposed between the two second conductive layers M2 in the second direction D2, and the block layer ES1 may be directly connected with the two second conductive layers M2.

In some embodiments, the thickness of the block layer ES1 may be less than the thickness of each of the second conductive layers M2 for reducing negative influence of the block layer ES1 on the related processes (for example, negative influence on an etching process for forming an opening H corresponding to the super via structure SV1 may be generated by an overly thick block layer ES1), but not limited thereto. Additionally, in some embodiments, a top surface TP1 of the block layer ES1 and the top surface TP2 of the second conductive layer M2 may be substantially coplanar. Therefore, the bottom surface BT1 of the block layer ES1 may be lower than the top surface TP2 of the second conductive layer M2 in the first direction D1, and the bottom surface BT1 of the block layer ES1 may be higher than a bottom surface BT2 of the second conductive layer M2 in the first direction D1. Additionally, in some embodiments, the second interconnection level L2 may include an etching stop layer 22 disposed between the dielectric layer 24 and the first interconnection level L1 in the first direction D1, and the third interconnection level L3 may include an etching stop layer 32 disposed between the dielectric layer 34 and the second interconnection level L2 in the first direction D1. The material composition of the etching stop layer 22 and the etching stop layer 32 may be different from the material composition of the dielectric layer 24 and the dielectric layer 34 for providing required etching selectivity in the manufacturing processes. In some embodiments, the material composition of the block layer ES1 may be different from the material composition of the dielectric layer 24 and/or the material composition of the etching stop layer 32 for providing required etching selectivity in the manufacturing processes.

In some embodiments, the super via structure SV1 may extend in the first direction D1 and penetrate through the dielectric layer 34, the etching stop layer 32, the block layer ES1, the dielectric layer 24, and the etching stop layer 22 located between the corresponding first conductive layer M1 and the corresponding third conductive layer M3 in the first direction D1 for contacting and being electrically connected with the corresponding first conductive layer M1 and the corresponding third conductive layer M3. In some embodiments, a common via structure (not illustrated) may be disposed between conductive layers adjacent to each other in the first direction D1 (such as being disposed between the first conductive layer M1 and the second conductive layer M2 or being disposed between the second conductive layer M2 and the third conductive layer M3) and extend in the first direction D1 for electrically connecting the conductive layers adjacent to each other, and the common via structure only penetrates through the dielectric layer and the etching stop layer located between the conductive layers adjacent to each other accordingly. Relatively, the super via structure SV1 may penetrate through the interconnection level (such as the second interconnection level L2) located between two interconnection levels, the length of the super via structure SV1 in the first direction D1 and the aspect ratio (such as a ratio of the depth to the width) of the super via structure SV1 may be greater than the length of the common via structure in the first direction D1 and the aspect ratio of the common via structure, respectively, and the cross-sectional shape of the super via structure SV1 may be similar to that of the common via structure. For example, the aspect ratio of the super via structure SV1 may range from 3 to 13, and the aspect ratio of the common via structure may be about 2, but not limited thereto. In some embodiments, a bottom surface S1 of the super via structure SV1 may contact the corresponding first conductive layer M1, a top surface S2 of the super via structure SV1 may contact the corresponding third conductive layer M3, and the width of the super via structure SV1 may gradually shrink from the top surface S2 to the bottom surface S1, but not limited thereto.

In some embodiments, the super via structure SV1 may penetrate through the block layer ES1 and directly contact the block layer ES1. A first portion P11 of the super via structure SV1 may penetrate through the etching stop layer 22, the dielectric layer 24, and the block layer ES1 in the first direction D1, a second portion P12 of the super via structure SV1 may penetrate through the etching stop layer 32 and the dielectric layer 34 located between the third conductive layer M3 and the second interconnection level L2 in the first direction D1, and the first portion P11 of the super via structure SV1 may be directly connected with the second portion P12 of the super via structure SV1. For instance, the portion of the super via structure SV1 penetrating through the etching stop layer 22 may be directly connected with the portion of the super via structure SV1 penetrating through the etching stop layer 32. In addition, the maximum width of the first portion P11 penetrating through the second interconnection level L2 (such as the width of the first portion P11 at the interface between the first portion P11 and the second portion P12) may be substantially equal to the minimum width of the second portion P12 (such as a width W1 shown in FIG. 2), and the width W1 of the first portion P11 may be less than a width W2 of the second portion P12 connected with the third conductive layer M3, but not limited thereto. Additionally, in some embodiments, the interconnection structure 101 may include a plurality of the super via structure SV1 and a plurality of the block layers ES1 disposed correspondingly. The super via structures SV1 may be electrically separated from one another and located corresponding to different first conductive layers M1 and different third conductive layers M3, or at least some of the super via structures SV1 may be located corresponding to the same first conductive layer M1 or the some third conductive layer M3 for being electrically connected with one another.

In some embodiments, the first conductive layer M1, the second conductive layer M2, the third conductive layer M3, and the super via structure SV1 may respectively include a barrier layer (not illustrated) and a low electrical resistivity material (not illustrated) disposed on the barrier layer, but not limited thereto. The low electrical resistivity material mentioned above may include an electrically conductive material having relatively lower electrical resistivity, such as copper, aluminum, or tungsten, and the barrier layer mentioned above may include titanium nitride, tantalum nitride, or other suitable electrically conductive barrier materials, but not limited thereto. The etching stop layer 22 and the etching stop layer 32 may include silicon oxide, silicon nitride, silicon carbonitride (SiCN), fluorosilicate glass (FSG), or other suitable dielectric materials. The dielectric layer 14, the dielectric layer 24, and the dielectric layer 34 may include a low dielectric constant (low-k) dielectric material (such as a dielectric material having dielectric constant lower than 2.9, but not limited thereto) or other suitable dielectric materials. The block layer ES1 may include aluminum nitride, silicon carbonitride, silicon oxycarbide (SiOC), or other dielectric etching blocking materials different from the dielectric layer 24.

Please refer to FIGS. 1-18. FIGS. 4-18 are schematic drawings illustrating a manufacturing method of the interconnection structure according to the first embodiment of the present invention, and FIG. 1 may be regarded as a schematic drawing in a step subsequent to FIG. 18, but not limited thereto. As shown in FIGS. 1-3, the manufacturing method of the interconnection structure in this embodiment may include the following steps. Firstly, the second interconnection level L2 is formed on the first interconnection level L1. The first interconnection level L1 includes the dielectric layer 14 and at least one first conductive layer M1, and the first conductive layer M1 is disposed in the dielectric layer 14. The second interconnection level L2 includes the dielectric layer 24, at least one second conductive layer M2, and at least one block layer ES1. The second conductive layer M2 and the block layer ES1 are disposed in the dielectric layer 24. The bottom surface BT1 of the block layer ES1 is lower than the top surface TP2 of the second conductive layer M2 in the first direction D1. The third interconnection level L3 and the super via structure SV1 are then formed. The third interconnection level L3 is formed on the second interconnection level L2, the third interconnection level L3 includes the dielectric layer 34 and at least one third conductive layer M3, and the third conductive layer M3 is disposed in the dielectric layer 34. The block layer ES1 is disposed between the third conductive layer M3 and the first conductive layer M1 in the first direction D1, and the super via structure SV1 penetrates through the block layer ES1 and the second interconnection level L2 in the first direction D1 and electrically connects the first conductive layer M1 and the third conductive layer M3.

Figure 4:
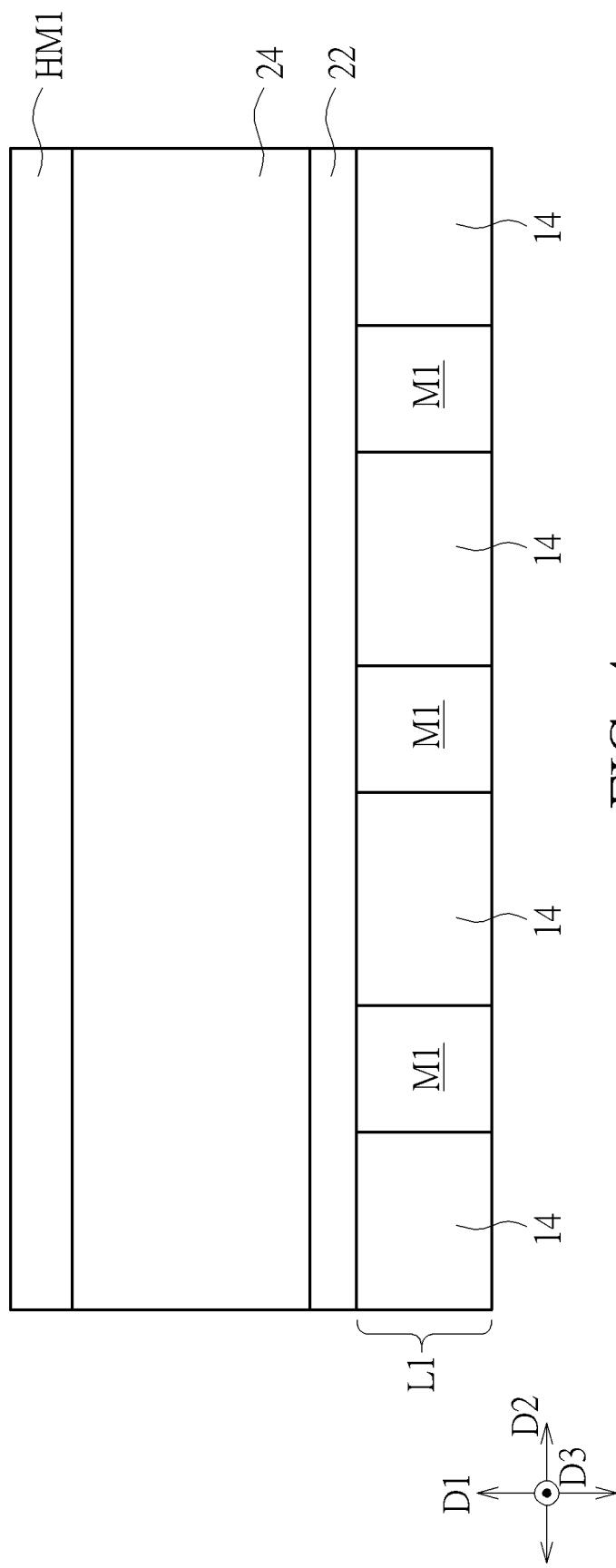
Figure 5:
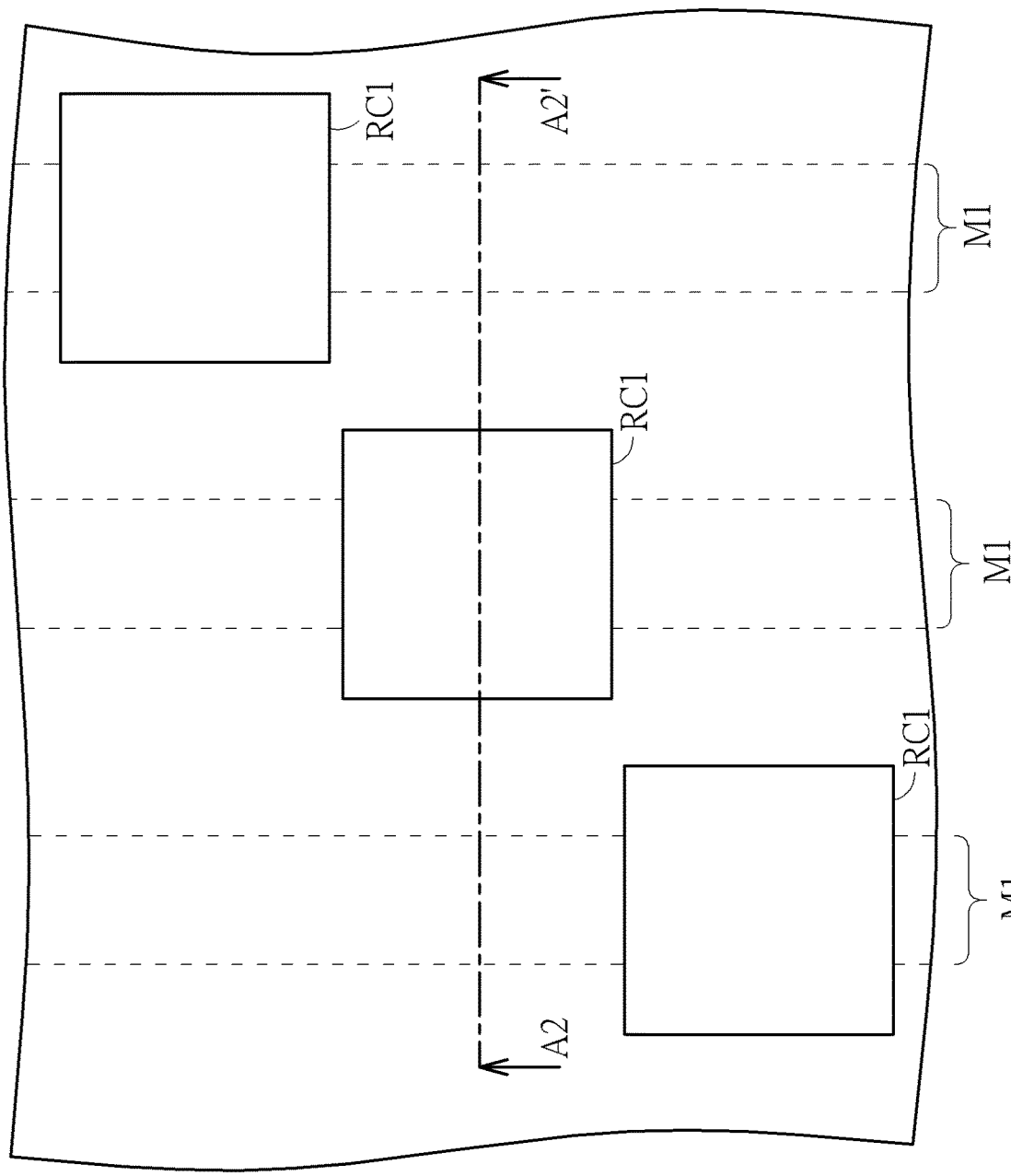
Figure 5:
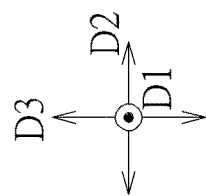
Figure 6:
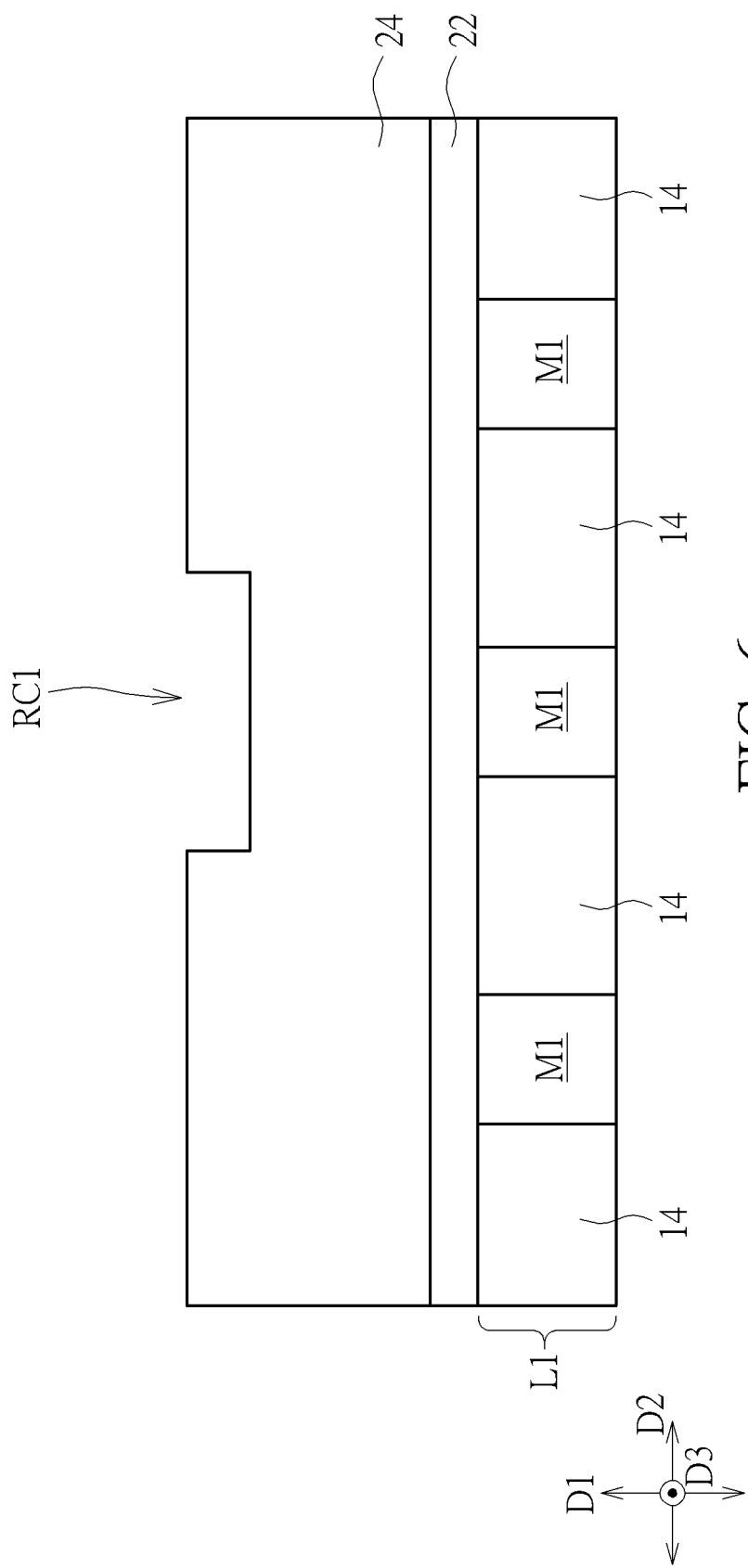
Figure 7:
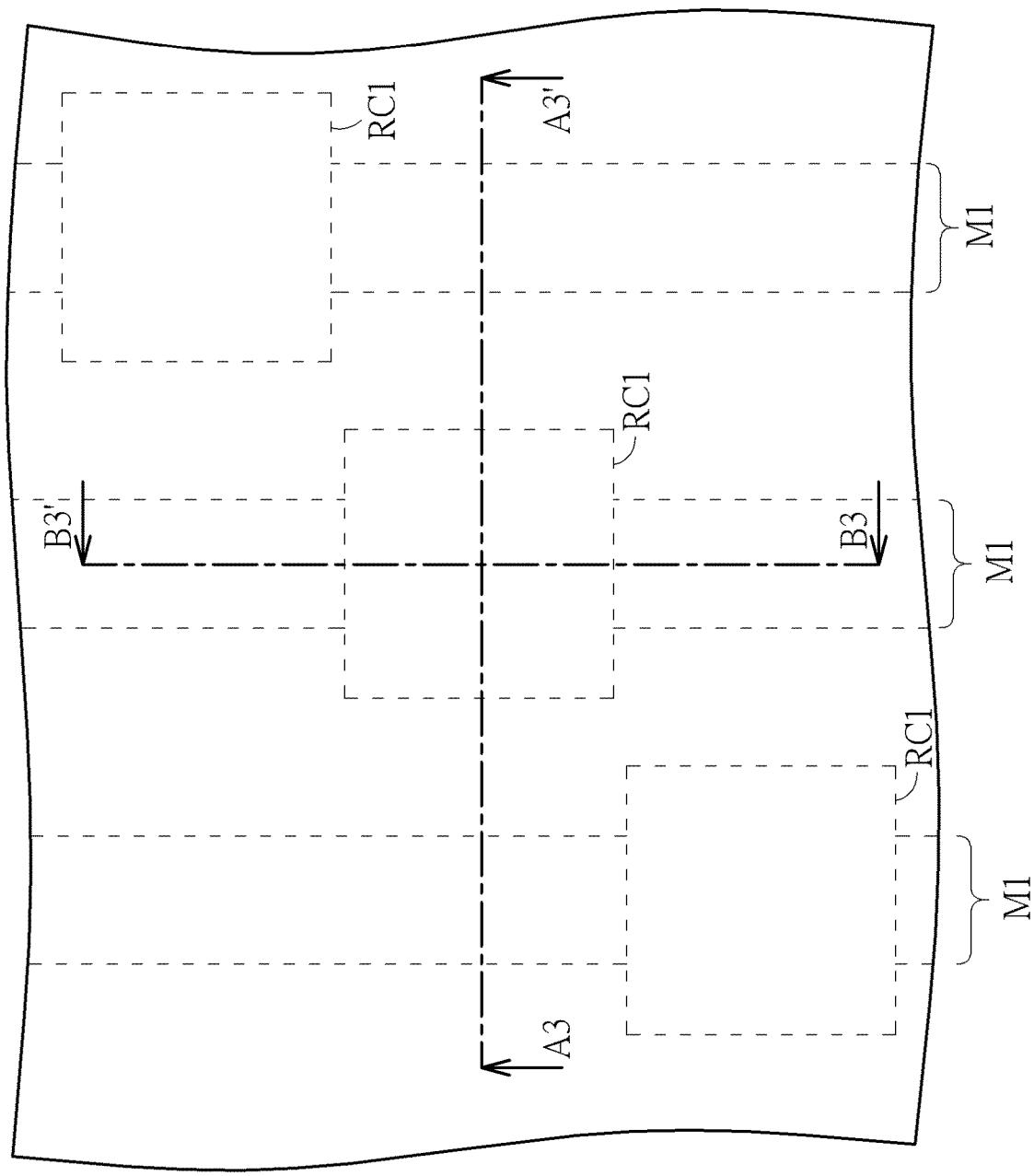
Figure 7:
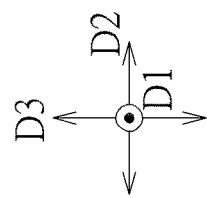
Figure 8:
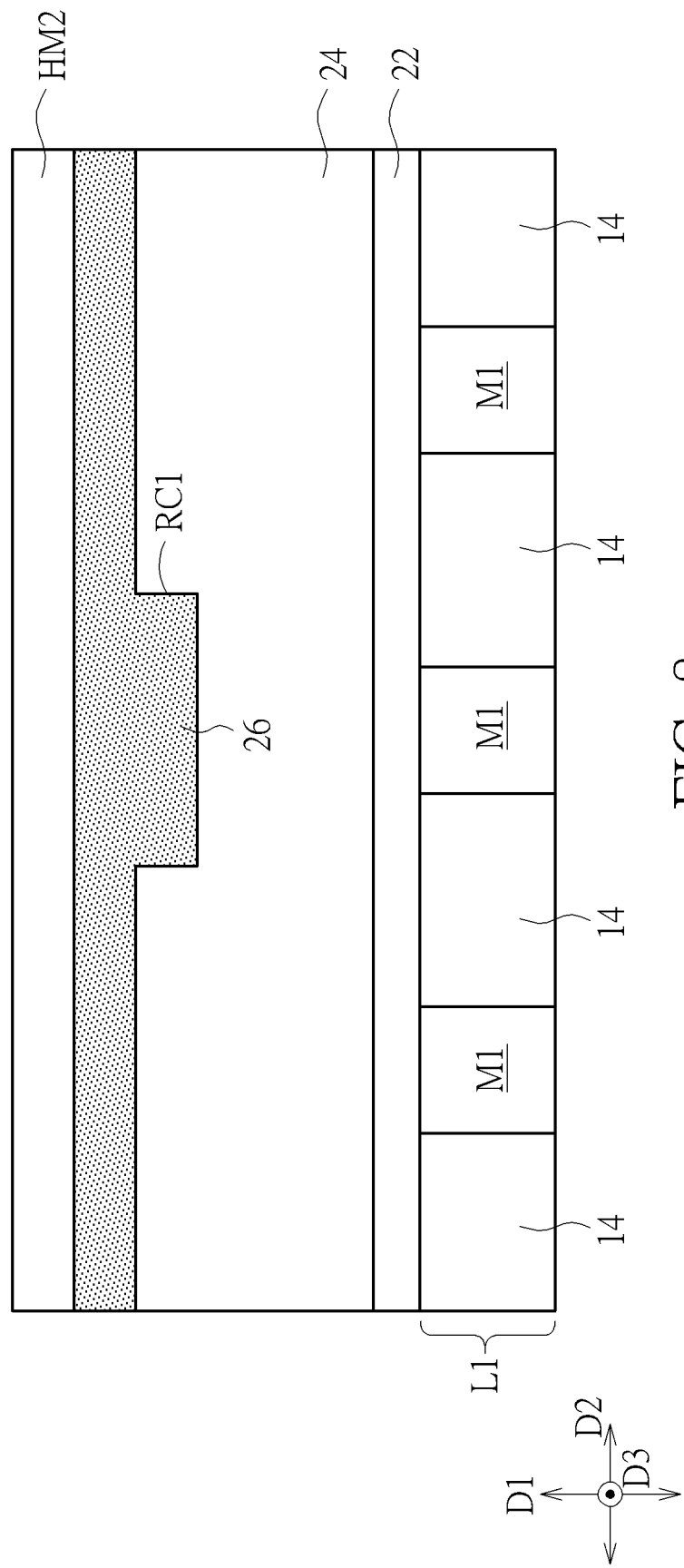
Figure 9:
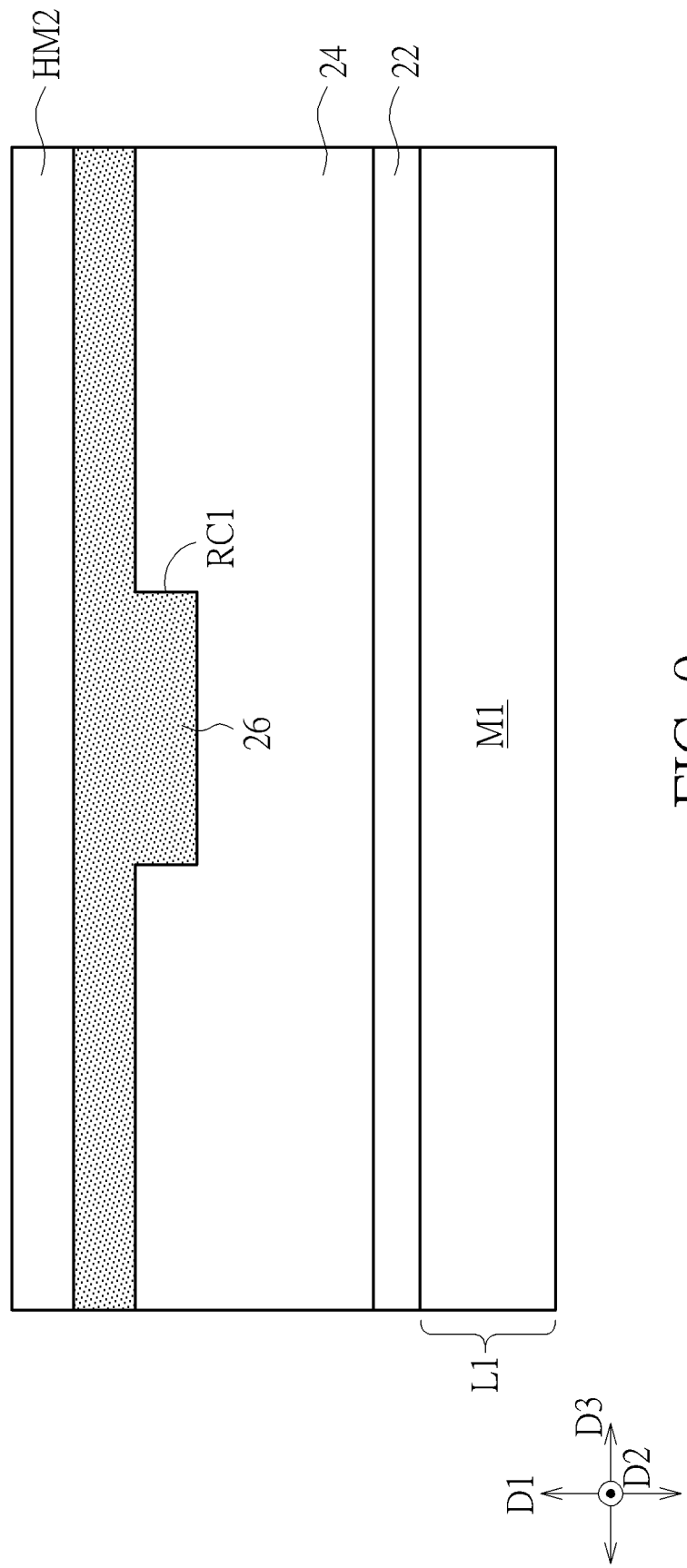
Figure 10:
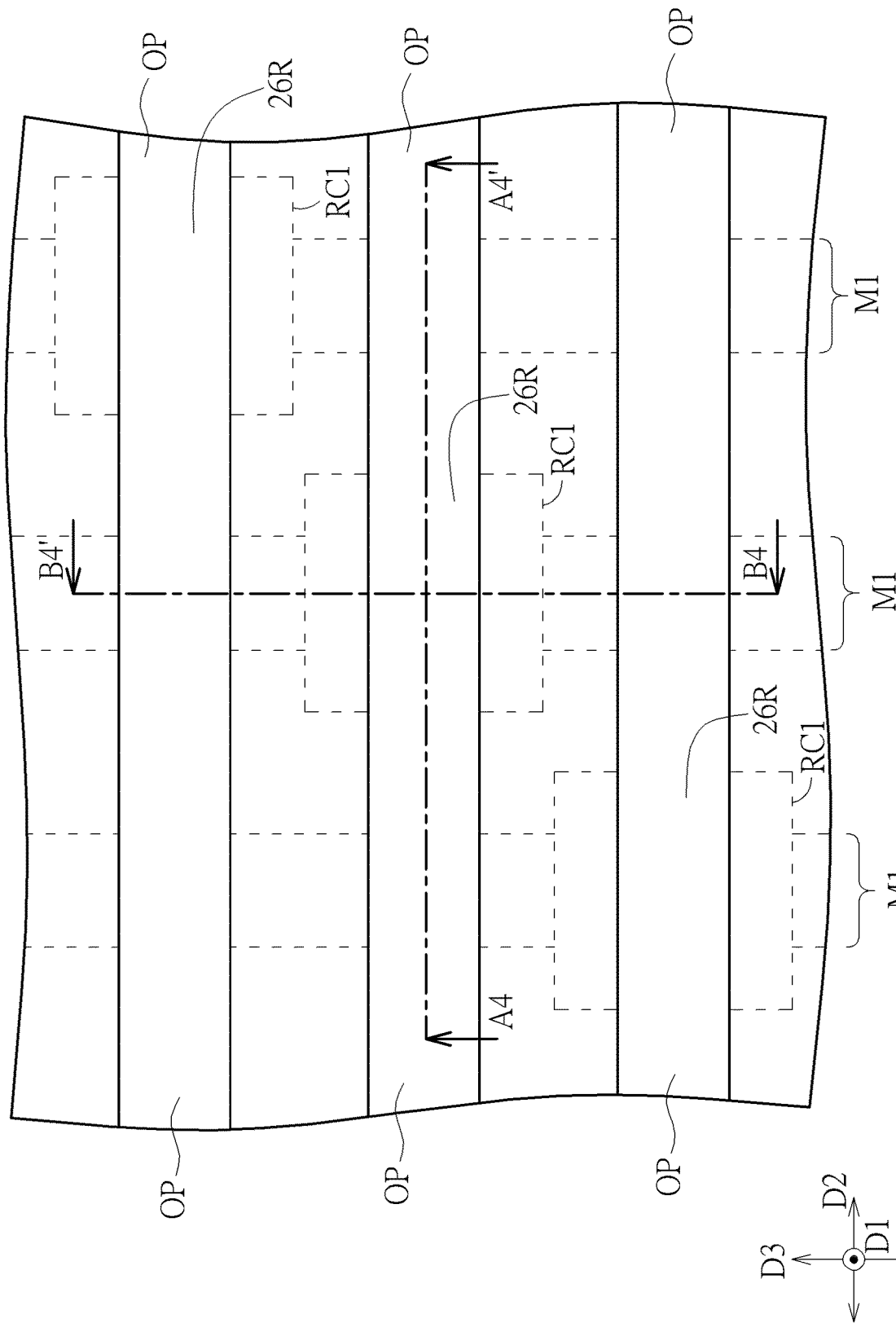
Figure 11:
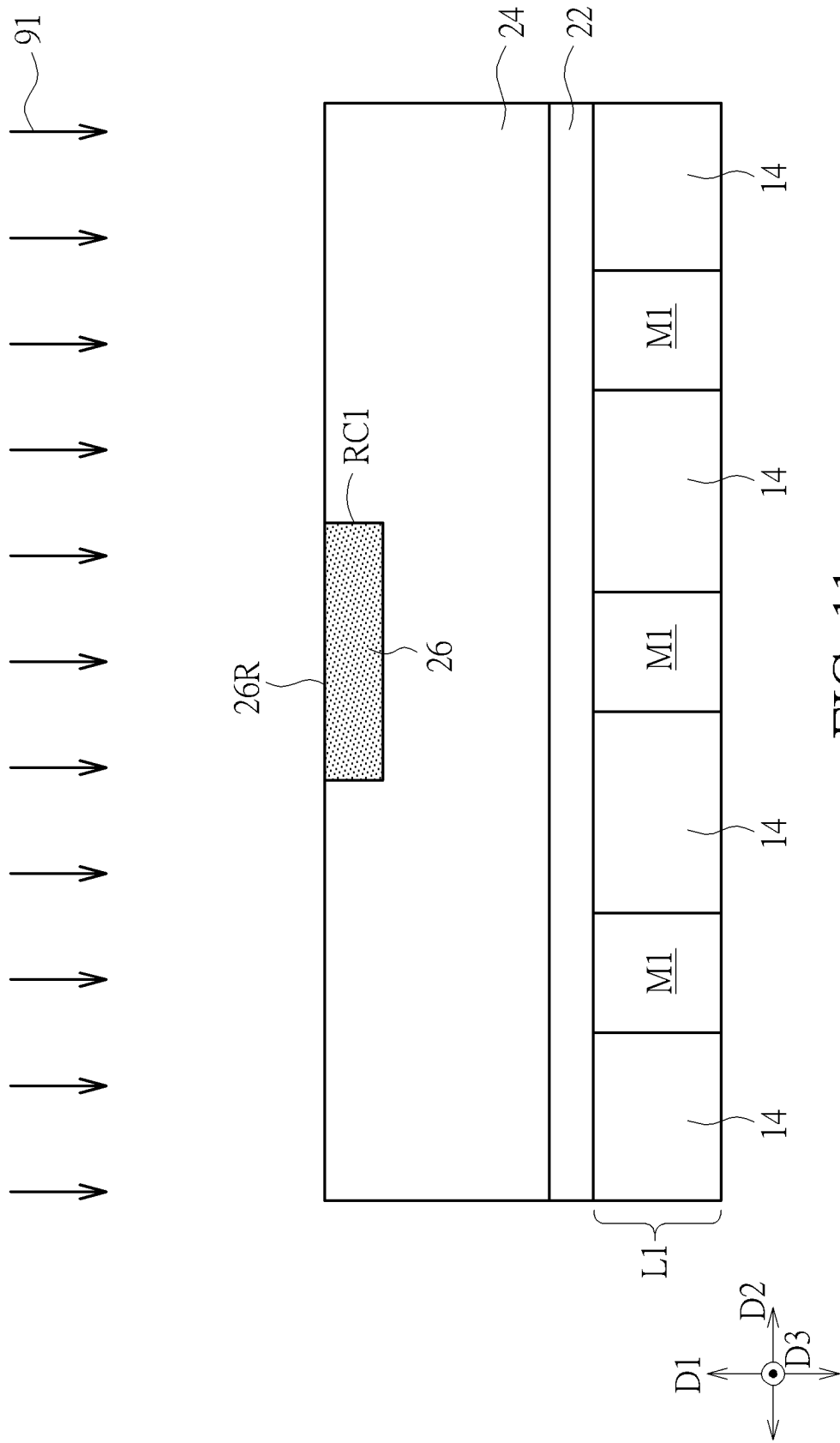
Figure 12:
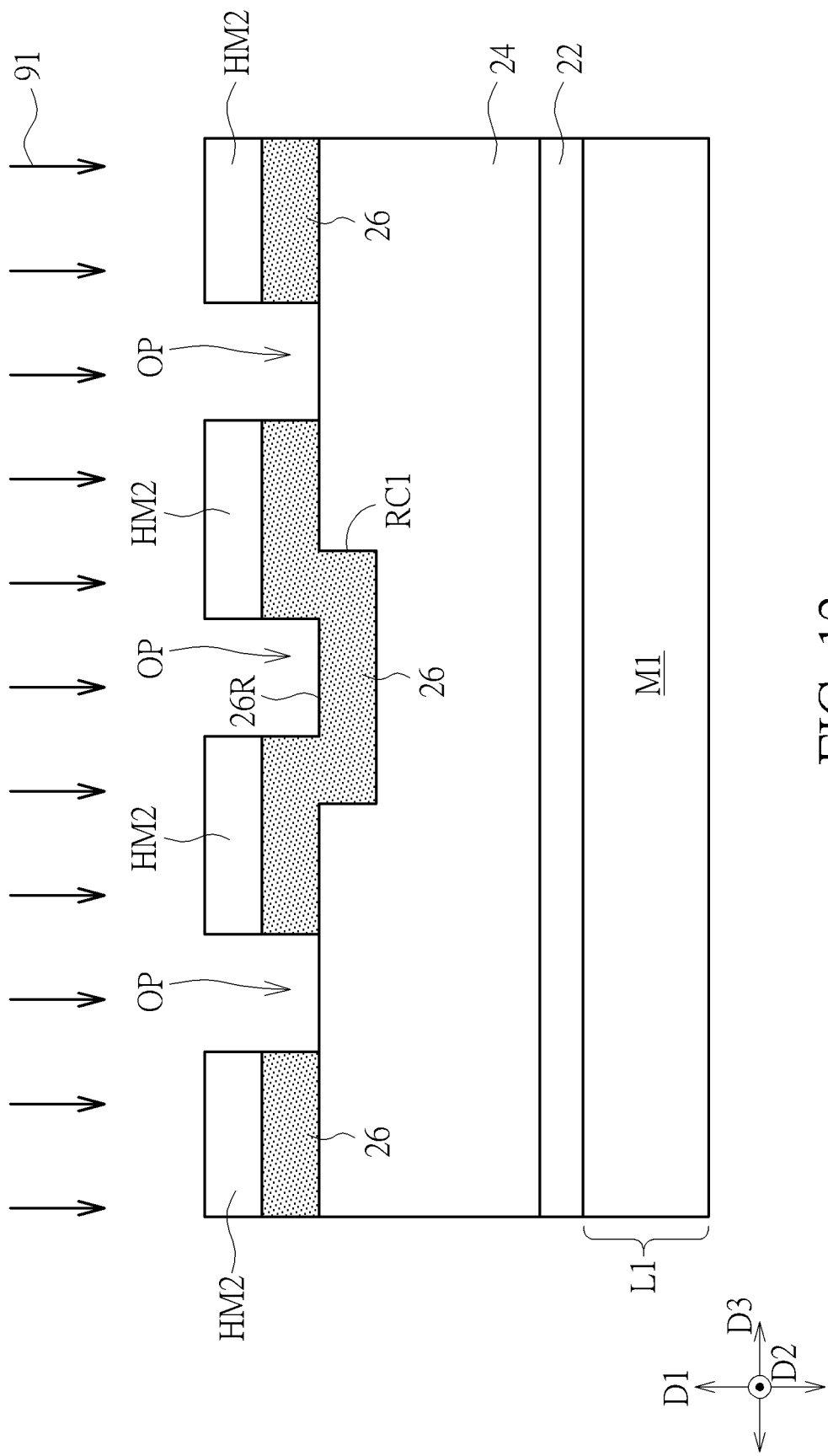
Figure 13:
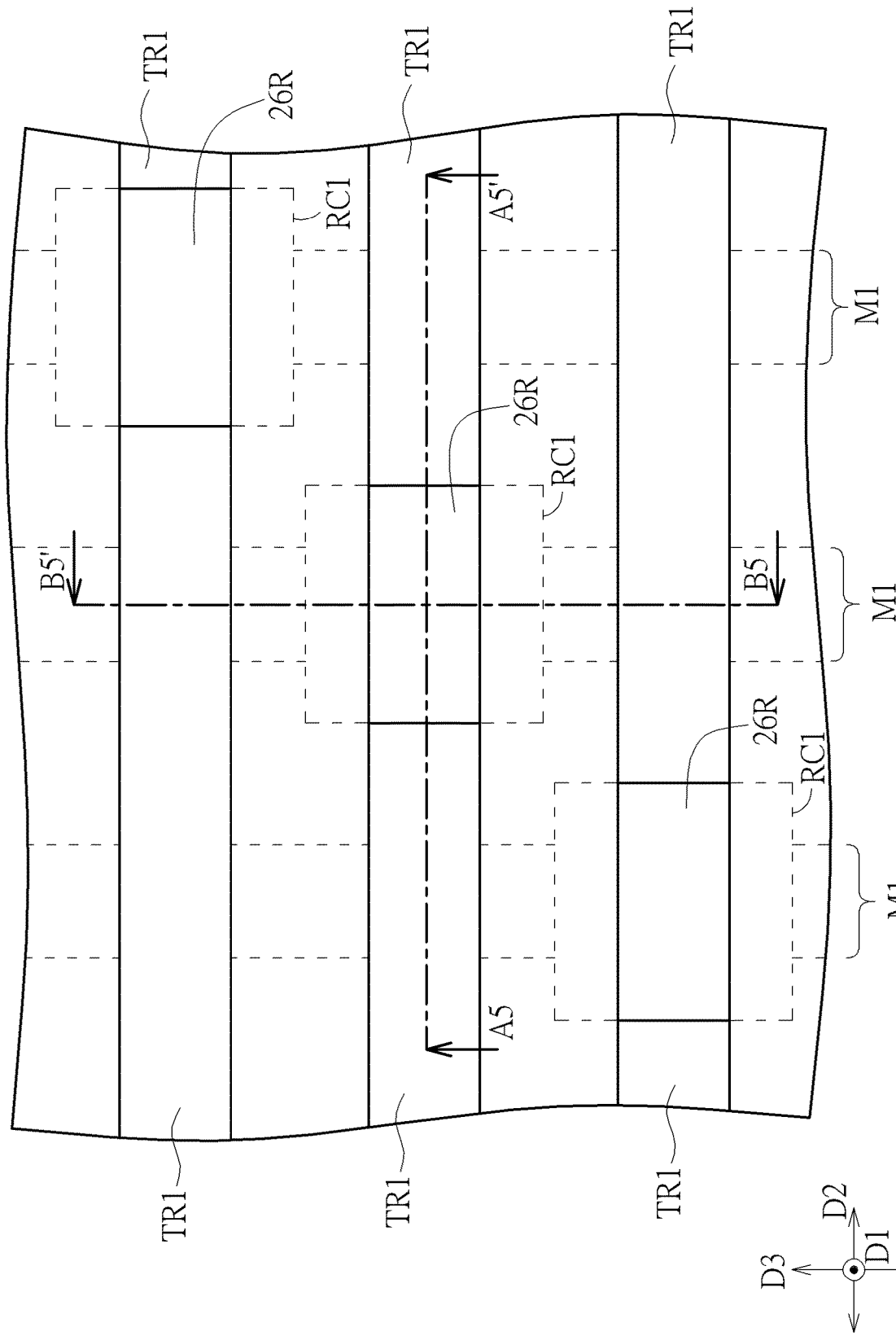
Figure 14:
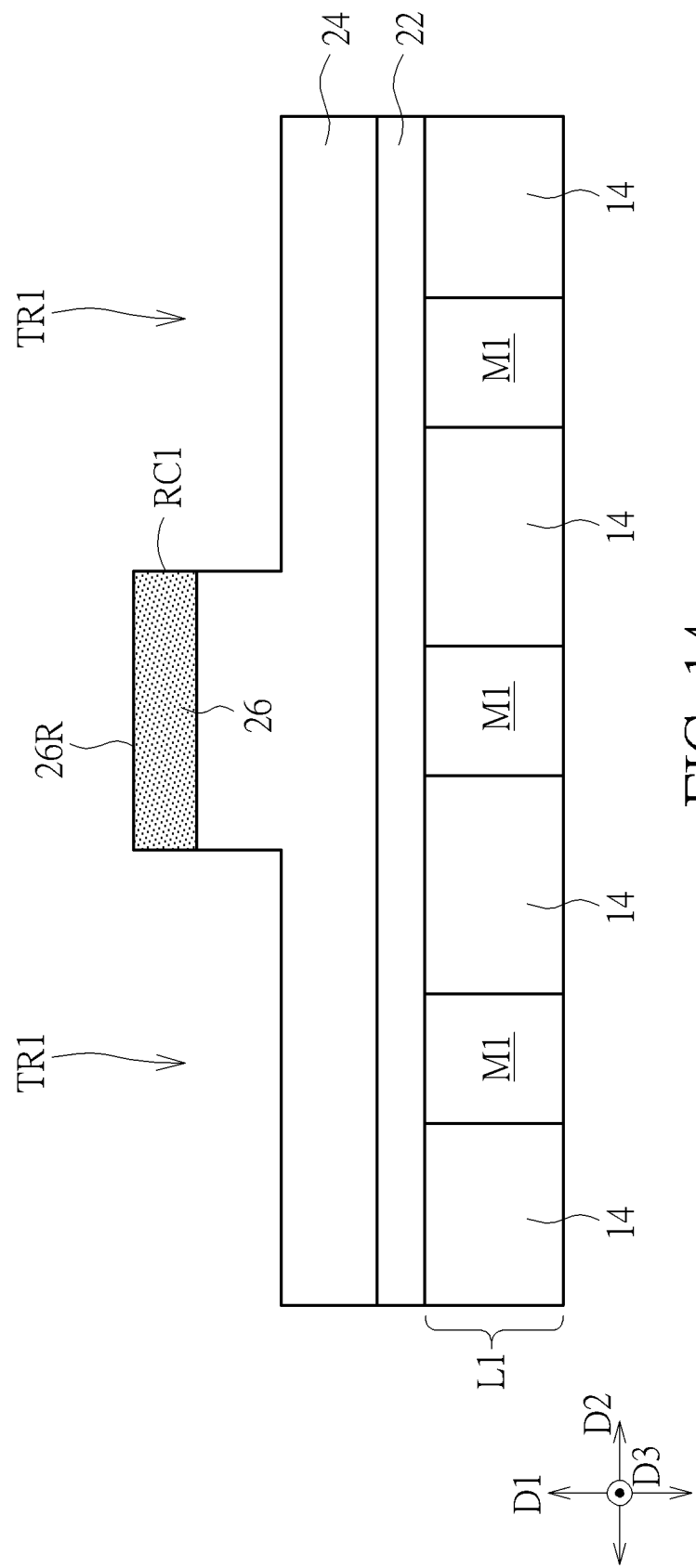
Figure 15:
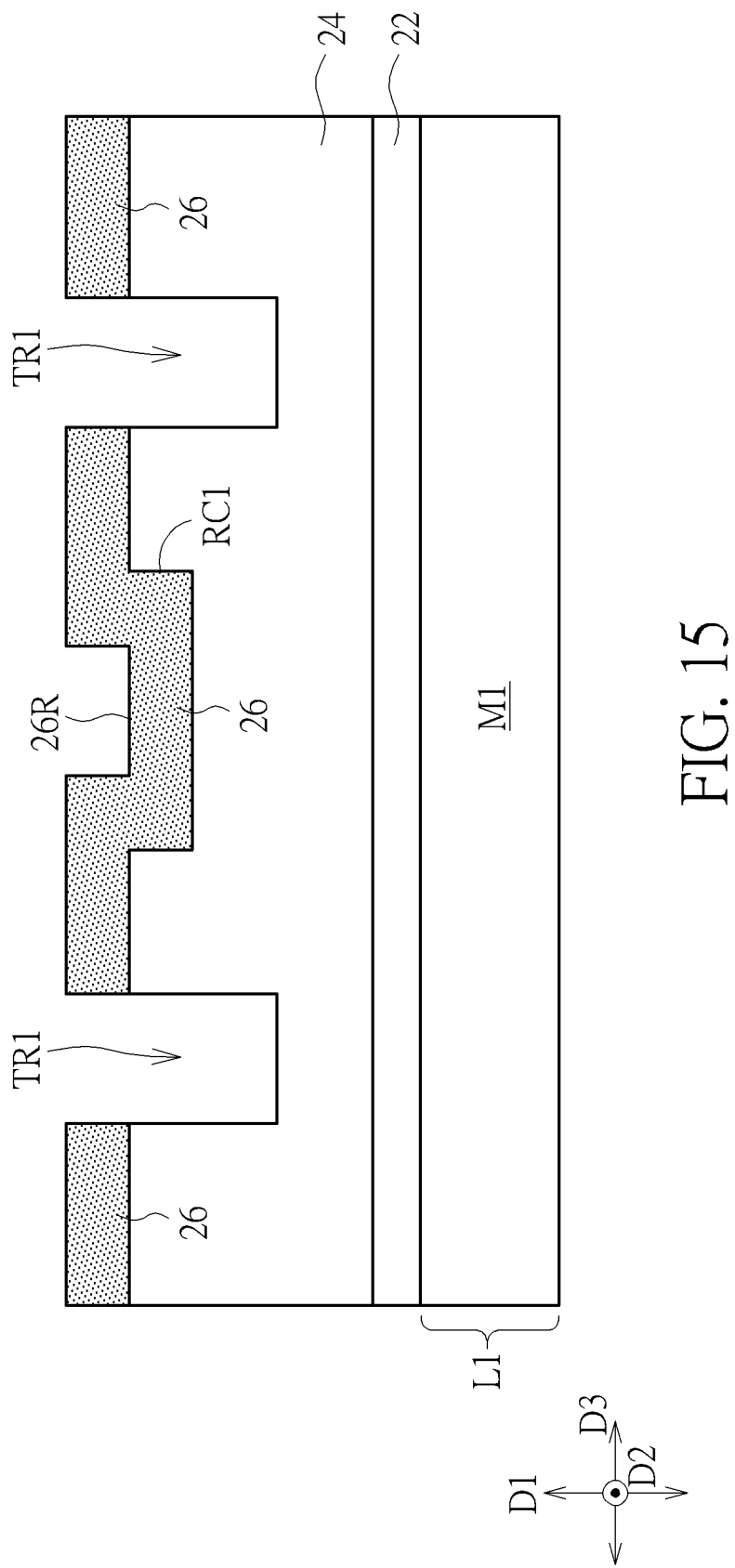
Figure 16:
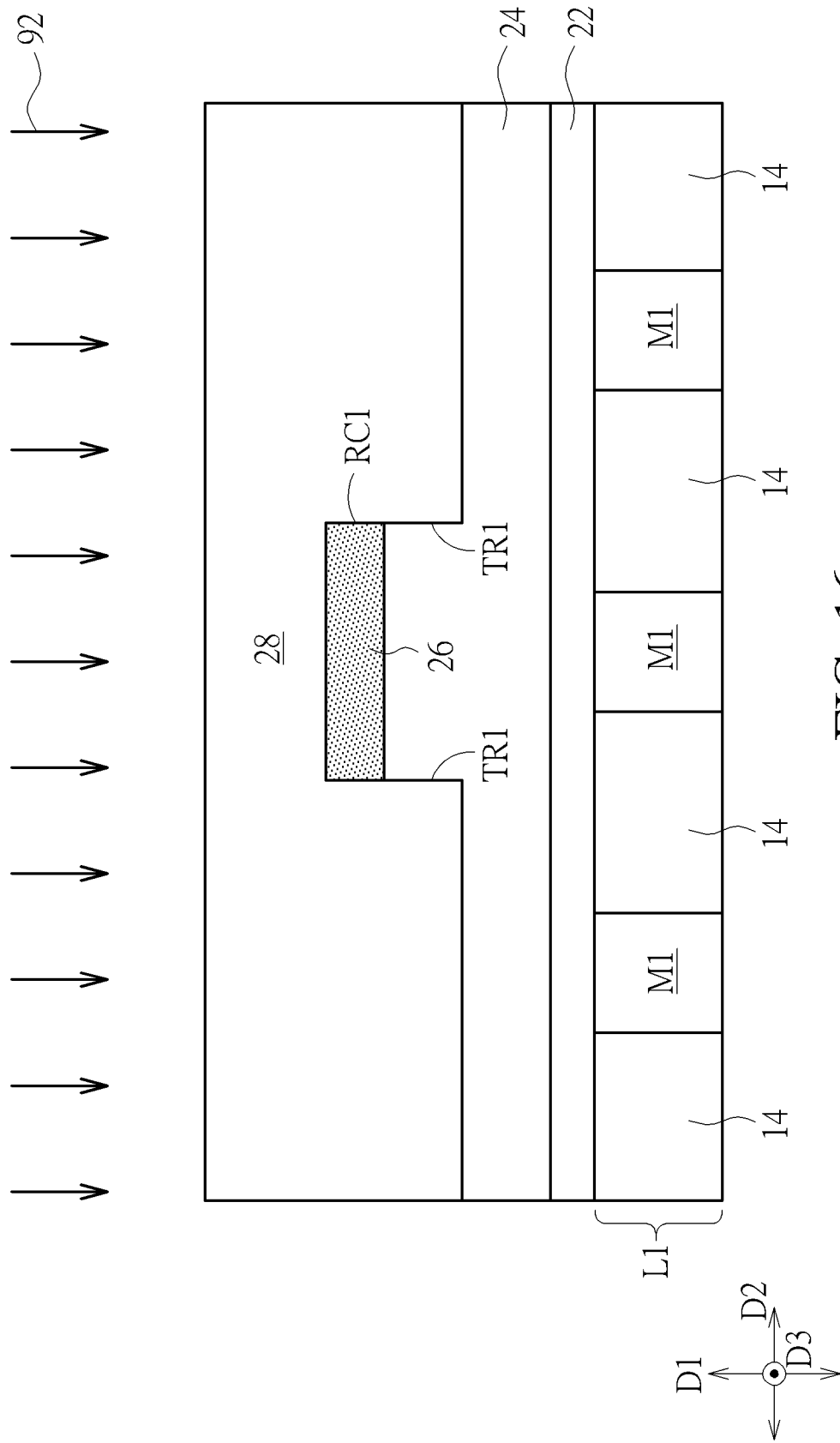
Figure 17:
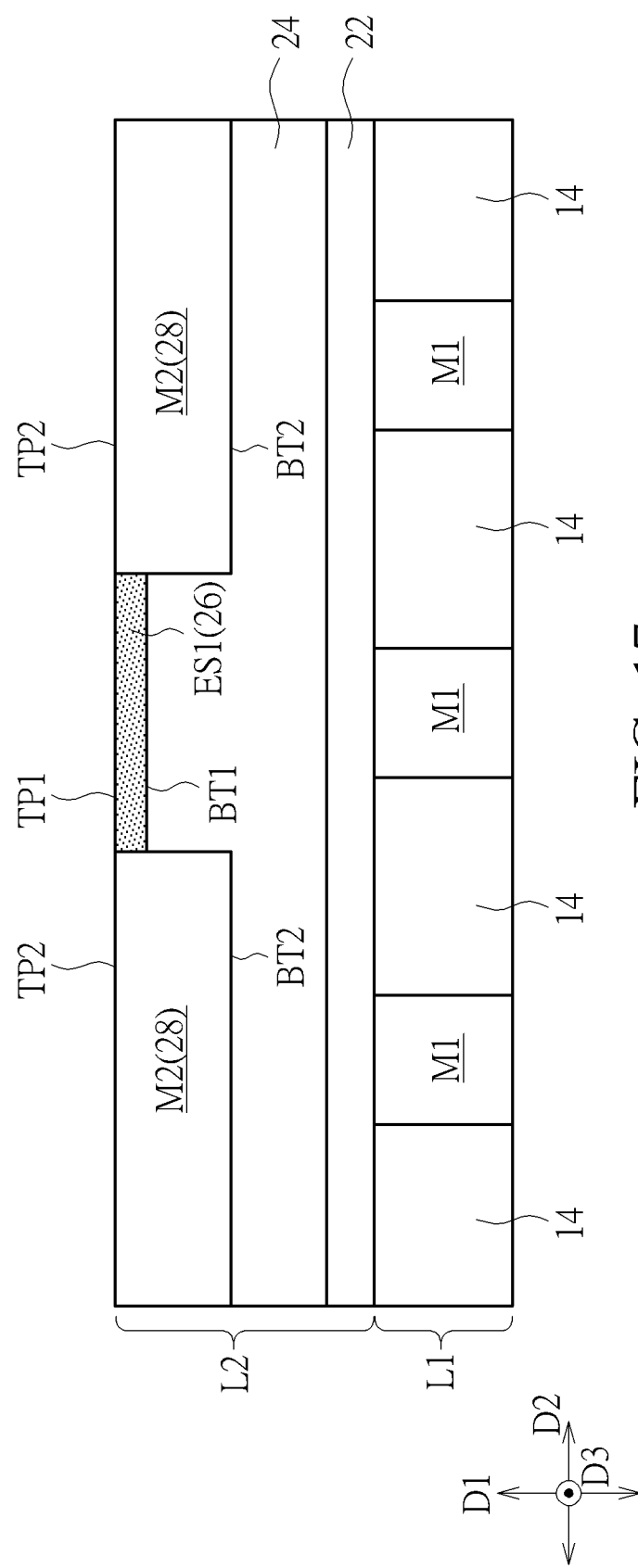

Specifically, the manufacturing method in this embodiment may include but is not limited to the following steps. As shown in FIG. 4, the etching stop layer 22 and the dielectric layer 24 may be sequentially formed on the first interconnection level L1, and a mask layer HM1 may be formed on the dielectric layer 24. Subsequently, as shown in FIGS. 4-6, a patterning process may be performed for forming one or a plurality of recesses RC1 in the dielectric layer 24, and the mask layer HM1 may be removed after the recesses RC1 are formed. In some embodiments, each of the recesses RC1 may overlap the corresponding first conductive layer M1 in the first direction D1 and/or when viewed in the first direction D1, and the recesses RC1 may be arranged misaligned with one another without being aligned in the second direction D2 for reducing the influence on the manufacturing of other conductive layers (such as the second conductive layers M2 described above), but not limited thereto. As shown in FIGS. 7-9, a block material 26 may then be formed on the dielectric layer 24, a portion of the block material 26 may be formed in the recesses RC1 and another portion of the block material 26 may be formed outside the recesses RC1. In some embodiments, the recesses RC1 may be fully filled with the block material 26, and the block material 26 located outside the recesses RC1 may cover the top surface of the dielectric layer 24. Subsequently, a mask layer HM2 may be formed on the block material 26, and the material composition of the mask layer HM2 may be different from that of the block material 26 for providing required etching selectivity in the subsequent patterning process. For instance, the mask layer HM2 may be a titanium nitride layer and the block material may be aluminum nitride, but not limited thereto.

As shown in FIGS. 10-15, a patterning process 91 may be performed for forming a plurality of trenches TR1 in the dielectric layer 24, and the above-mentioned conductive layers disposed in the dielectric layer 24 may be formed in the trenches TR1 in the subsequent processes. In some embodiments, the patterning process 91 may include a plurality of etching steps for etching the mask layer HM2, the block material 26, and the dielectric layer 24, respectively. For example, one or a plurality of etching steps may be carried out for etching the mask layer HM2 and the block material 26 so as to form a plurality of openings OP. Each of the openings OP may be elongated in the second direction D2, and each of the openings OP may expose a part of the dielectric layer 24. In some embodiments, each of the openings OP may overlap one of the recesses RC1 in the first direction D1 and/or when viewed in the first direction D1, and a recessed surface 26R may be formed on the block material 26 located above the recess RC1 by the step of forming the opening OP, but not limited thereto. In some embodiments, according to some design considerations, the position of the openings OP may be away from the recesses RC1 for forming the openings OP without overlapping the recesses RC1 in the first direction D1 and without forming the recessed surface 26R. After the step of forming the openings OP, an etching step using the mask layer HM2 and the block material 26 as a mask may be performed to the dielectric layer 24 for forming one or a plurality of trenches TR1 in the dielectric layer 24, and the mask layer HM2 may be removed after the trenches TR1 are formed. Therefore, two of the trenches TR1 corresponding to the same opening OP may be located at two opposite sides of the recess RC1 in the second direction D2 and directly connected with the recess RC1, and two opposite side surfaces of the block material 26 located in the recess RC1 in the second direction D2 may be exposed by the two if the trenches TR1. In some embodiments, the patterning process 91 may be regarded as a process for forming the trenches TR1, and a part of the block material 26 located above the recess RC1 in the first direction D1 may be removed by the process of forming the trench TR1 (such as the patterning process 91) for forming the recessed surface 26R described above, but not limited thereto.

As shown in FIGS. 13-17, after the step of forming the trenches TR1, a conductive material 28 may be formed, a portion of the conductive material 28 may be formed in the trenches TR1 and another portion of the conductive material 28 may be formed outside the trenches TR1. After the step of forming the conductive material 28, a planarization process 92 may be carried out for removing the conductive material 28 located outside the trenches TR1 and forming the second conductive layers M2 in the trenches TR1. In other words, the conductive material 28 remaining in the trench TR1 after the planarization process 92 may become the second conductive layer M2. Additionally, in some embodiments, the block material 26 located outside the recess RC1 may be removed by the planarization process 92 concurrently, and the block material 26 remaining after the planarization process 92 may become the block layer ES1. Therefore, the second interconnection level L2 including the block layer ES1, the second conductive layers M2, the dielectric layer 24, and the etching stop layer 22 may be formed by the planarization process 92. The planarization process 92 may include a chemical mechanical polishing (CMP) process, an etching back process, or other suitable planarization approaches. In addition, the top surface TP1 of the block layer ES1 and the top surface TP2 of the second conductive layer M2 may be substantially coplanar because the block layer ES1 and the second conductive layer M2 may be formed concurrently by the planarization process 92, but not limited thereto. It is worth noting that the method of forming the second conductive layer M2 and the block layer ES may include but is not limited to the steps described above. In other words, the second conductive layer M2 and the block layer ES in this embodiment may be formed by other suitable approaches according to some design considerations.

Figure 18:
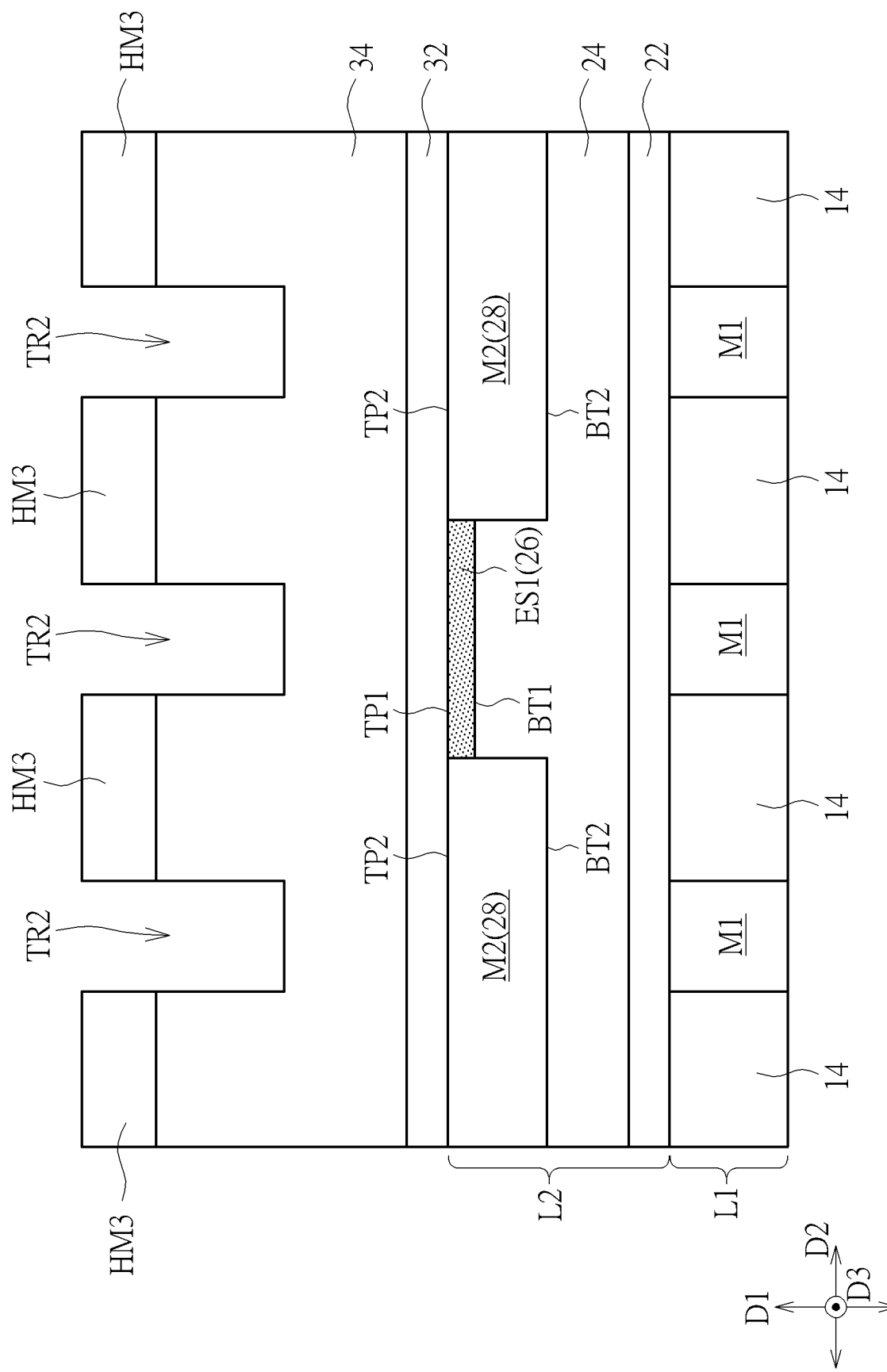

As shown in FIG. 18, the etching stop layer 32 and the dielectric layer 34 may be formed on the second interconnection level L2, and a mask layer HM3 formed on the dielectric layer 34 may be used in a patterning process for forming one or a plurality of trenches TR2 in the dielectric layer 34. The above-mentioned conductive layers disposed in the dielectric layer 34 may be formed in the trenches TR2 correspondingly in the subsequent processes. As shown in FIG. 18 and FIG. 2, the mask layer HM3 may be removed after the trenches TR2 are formed, and the opening H corresponding to the super via structure SV1 may be formed in the trench TR2 before the step of forming the third conductive layers M3. The opening H may extend in the first direction D1 and penetrate through the etching stop layer 22, the dielectric layer 24, the block layer ES1, the etching stop layer 32, and the dielectric layer 34 located between the first conductive layer M1 and the third conductive layer M3 corresponding to the super via structure SV1. In some embodiments, a plurality of etching steps may be used to etch the dielectric layer 34, the etching stop layer 32, the block layer ES1, the dielectric layer 24, and the etching stop layer 22 corresponding to the super via structure SV1, respectively, for forming the opening H, and higher etching selectivity between the block layer ES and other material layer (such as the dielectric layer 34, the etching stop layer 32, the dielectric layer 24, and/or the etching stop layer 22) may be obtained by material selection, and the process difficulties and/or related defects generated by the opening H with higher aspect ratio may be improved accordingly. In addition, the third conductive layers M3 and the super via structure SV1 may be formed concurrently by forming an electrically conductive material in the opening H and the trenches TR2 and performing a planarization process to the electrically conductive material, the material composition of the third conductive layer M3 may be identical to that of the super via structure SV1, and the super via structure SV1 may be directly connected with the third conductive layer M3 to be a monolithic structure accordingly, but not limited thereto. As shown in FIGS. 1-3, the super via structure SV1 may be formed self-aligned by the manufacturing method described above. For example, the trenches TR2 and the block layer ES1 may generate constraint effect to the position of the opening H in the second direction D2 and the third direction D3, but not limited thereto. In addition, the block layer ES1 may also be used to electrically isolating the super via structure SV1 from the second conductive layers M2 adjacent to the super via structure SV1, short between the super via structure SV1 and the second conductive layer M2 may be avoided, and the time dependent dielectric breakdown (TDDB) between the super via structure SV1 and other conductive layers may be improved. The related process window, manufacturing yield, and/or reliability of the super via structure and the interconnection structure may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 19:
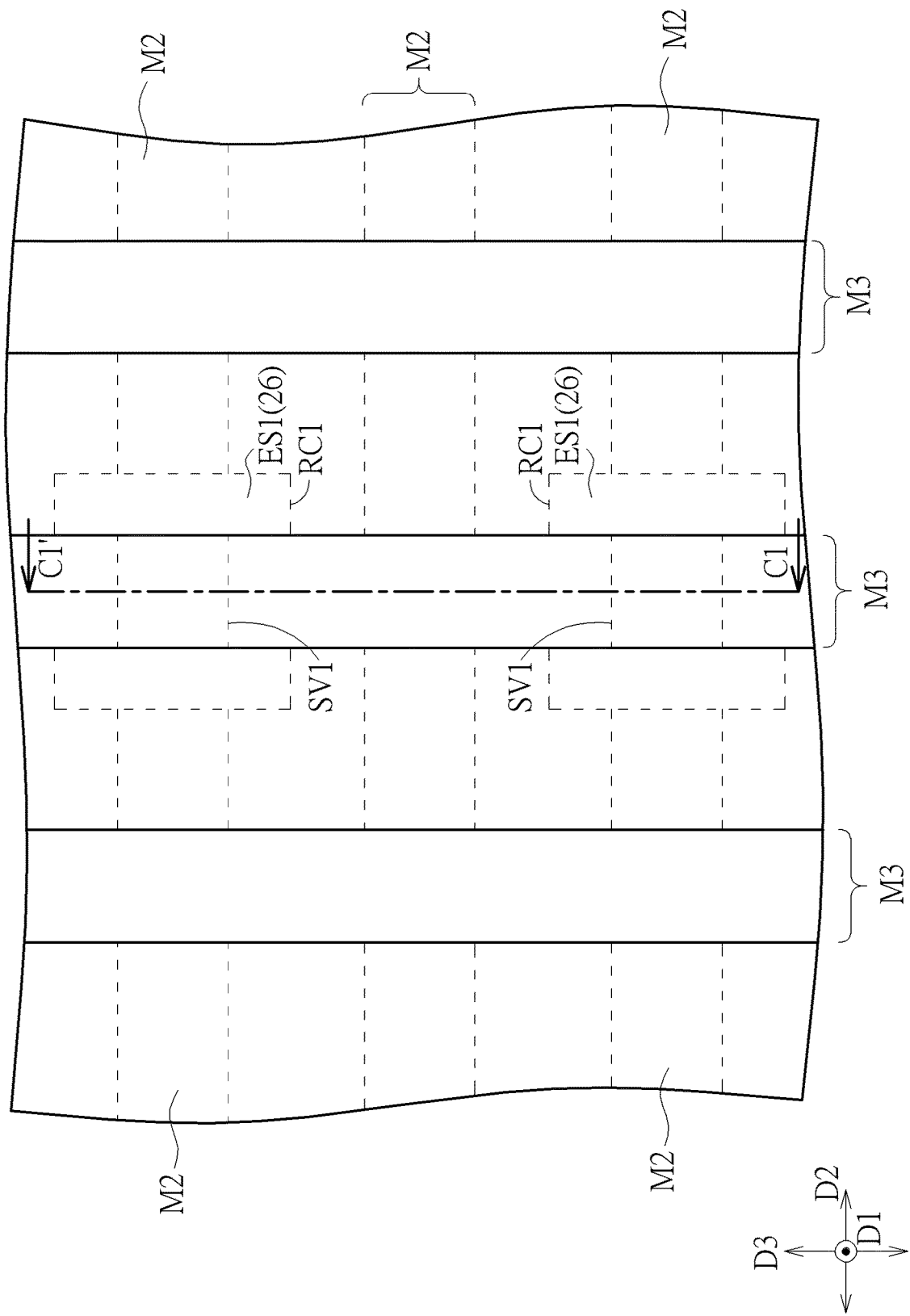
FIG. 19 is a schematic drawing illustrating a top view of an interconnection structure according to a second embodiment of the present invention.
Figure 20:
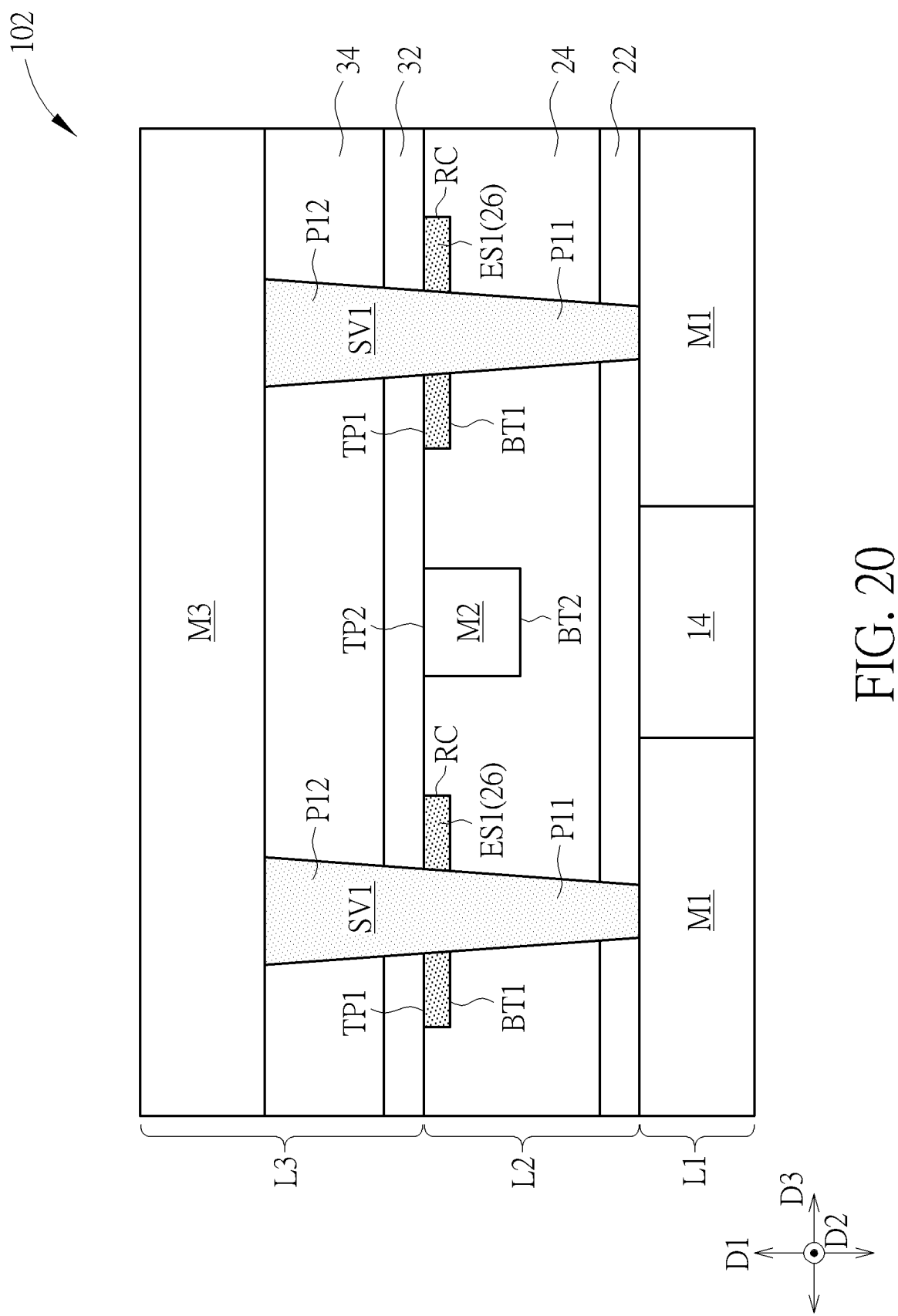
FIG. 20 is a cross-sectional diagram taken along a line C1-C1' in FIG. 19.

Please refer to FIG. 19 and FIG. 20. FIG. 19 is a schematic drawing illustrating a top view of an interconnection structure 102 according to a second embodiment of the present invention, and FIG. 20 is a cross-sectional diagram taken along a line C1-C1' in FIG. 19. As shown in FIG. 19 and FIG. 20, the interconnection structure 102 may include two super via structures SV1 and two block layers ES1 disposed corresponding to the two super via structures SV1, and the two super via structures SV1 may be disposed adjacent to each other in the third direction D3. In some embodiments, the two super via structures SV1 may be connected with different first conductive layers M1, and the two super via structures SV1 may be connected with the same third conductive layer M3. Therefore, the first conductive layers M1 may be electrically connected with each other via the two super via structures SV1 and the third conductive layer M3 located corresponding to the two super via structures SV1, but not limited thereto. In some embodiments, according to other design considerations, the super via structures SV1 may be connected with the same first conductive layer M1 and connected with different third conductive layers M3 for forming required electrical connections.

Figure 21:
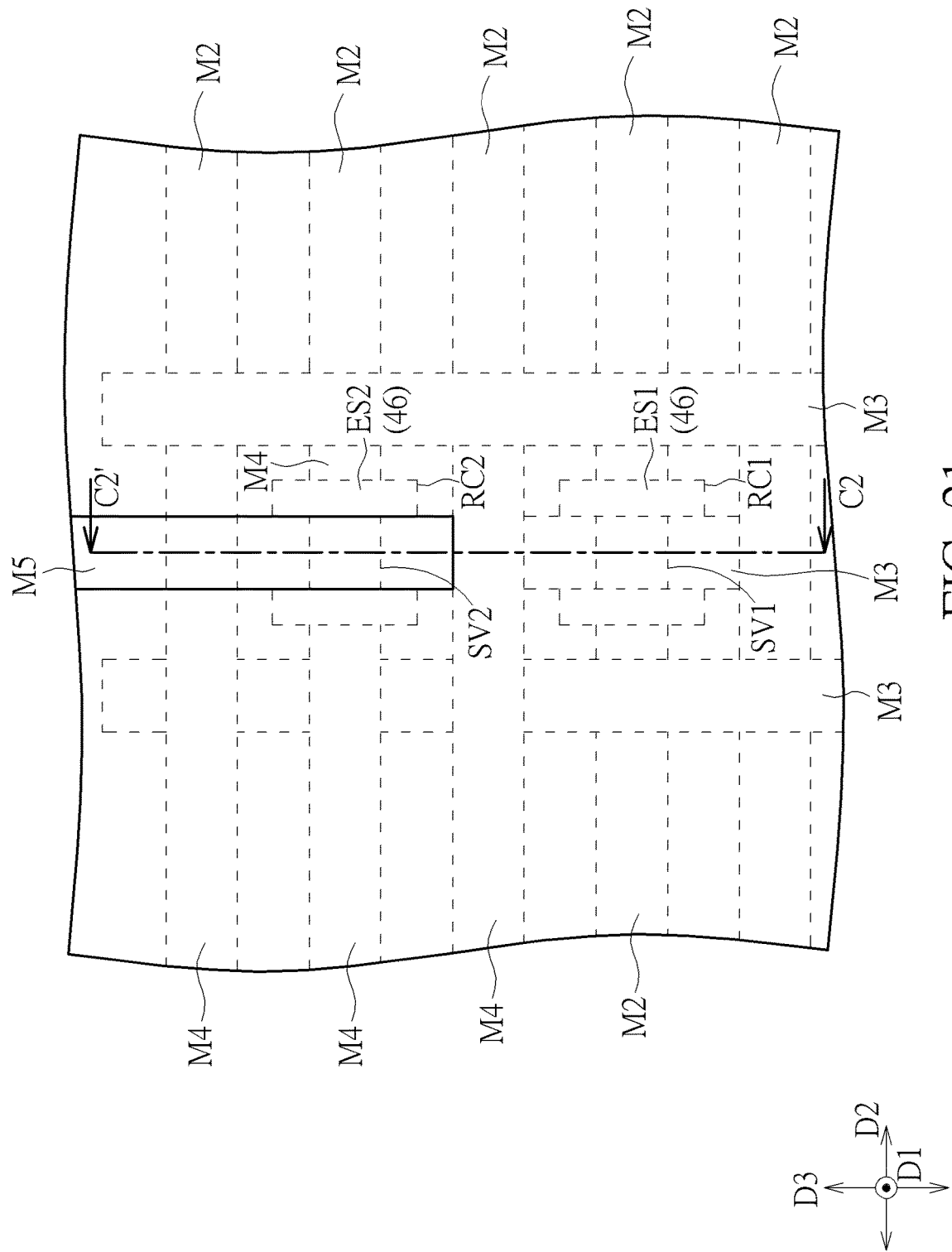
FIG. 21 is a schematic drawing illustrating a top view of an interconnection structure according to a third embodiment of the present invention.
Figure 22:
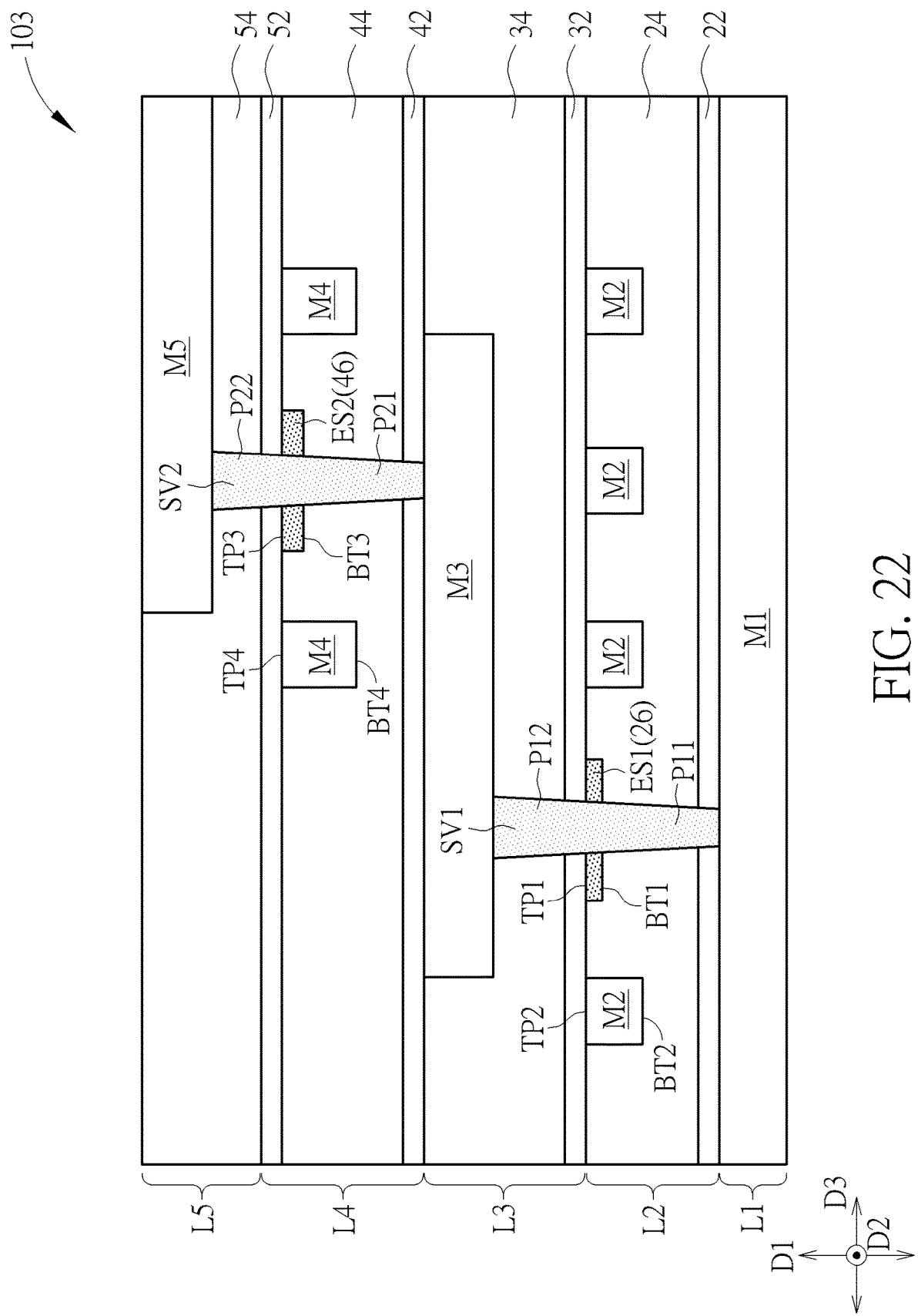
FIG. 22 is a cross-sectional diagram taken along a line C2-C2' in FIG. 21.

Please refer to FIG. 21 and FIG. 22. FIG. 21 is a schematic drawing illustrating a top view of an interconnection structure 103 according to a third embodiment of the present invention, and FIG. 22 is a cross-sectional diagram taken along a line C2-C2' in FIG. 21. As shown in FIG. 21 and FIG. 22, the interconnection structure 103 may further include a fourth interconnection level L4, a fifth interconnection level L5, and at least one super via structure SV2. The fourth interconnection level L4 may be disposed on the third interconnection level L3, and the fifth interconnection level L5 may be disposed on the fourth interconnection level L4. The fourth interconnection level L4 may include a dielectric layer 44, at least one fourth conductive layer M4, and at least one block layer ES2. The fourth conductive layer M4 and the block layer ES2 may be disposed in the dielectric layer 44, and a bottom surface BT3 of the block layer ES2 may be lower than a top surface TP4 of the fourth conductive layer M4 in the first direction D1. The fifth interconnection level L5 may include a dielectric layer 54 and at least one fifth conductive layer M5 disposed in the dielectric layer 54. The fourth conductive layer M4 and the fifth conductive layer M5 may be regarded as trench conductors disposed in the dielectric layer 44 and the dielectric layer 54 and elongated in the second direction D2 and the third direction D3, respectively, and the block layer ES2 may be disposed within a recess RC2 in the dielectric layer 44. The super via structure SV2 may penetrate through the block layer ES2 and the fourth interconnection level L4 in the first direction D1 and electrically connecting the third conductive layer M3 and the fifth conductive layer M5 located corresponding to the super via structure SV2. In some embodiments, the relative relationship between the super via structure SV2, the block layer ES2, and the fourth conductive layer M4 and the corresponding manufacturing method may be similar to the relative relationship between the super via structure SV1, the block layer ES1, and the second conductive layer M2 and the corresponding manufacturing method described above, but not limited thereto. For example, the bottom surface BT3 of the block layer ES2 may be higher than a bottom surface BT4 of the fourth conductive layer M4 in the first direction D1, and a top surface TP3 of the block layer ES2 and the top surface TP4 of the fourth conductive layer M4 may be substantially coplanar. In addition, the super via structure SV2 may penetrate through the block layer ES2 and directly contact the block layer ES2. A first portion P21 of the super via structure SV2 may penetrate through an etching stop layer 42, the dielectric layer 44, and the block layer ES2 in the first direction D1, a second portion P22 of the super via structure SV2 may penetrate through an etching stop layer 52 and the dielectric layer 54 located between the fifth conductive layer M5 and the fourth interconnection level L4 in the first direction D1, and the first portion P21 of the super via structure SV2 may be directly connected with the second portion P22 of the super via structure SV2. For instance, the portion of the super via structure SV2 penetrating through the etching stop layer 42 may be directly connected with the portion of the super via structure SV2 penetrating through the etching stop layer 52.

In some embodiments, the fourth interconnection level L4 may include the etching stop layer 42 disposed between the dielectric layer 44 and the third interconnection level L3 in the first direction D1, and the fifth interconnection level L5 may include the etching stop layer 52 disposed between the dielectric layer 54 and the fourth interconnection level L4 in the first direction D1. The super via structure SV2 may extend in the first direction D1 and penetrate through the dielectric layer 54, the etching stop layer 52, the block layer ES2, the dielectric layer 44, and the etching stop layer 42 located between the corresponding third conductive layer M3 and the corresponding fifth conductive layer M5 in the first direction D1 for contacting and being electrically connected with the corresponding third conductive layer M3 and the corresponding fifth conductive layer M5. Additionally, the material composition of the dielectric layer 44 and the dielectric layer 54 may be similar to that of the dielectric layer 24 and/or the dielectric layer 34 described above; the material composition of the etching stop layer 42 and the etching stop layer 52 may be similar to that of the etching stop layer 22 and/or the dielectric layer 32 described above; the material composition of the fourth conductive layer M4 and the fifth conductive layer M5 may be similar to that of the second conductive layer M2 and/or the third conductive layer M3 described above; the material composition of the super via structure SV2 may be similar to that of the super via structure SV1 described above; and the material composition of the block layer ES2 may be similar to that of the block layer ES1 described above, but not limited thereto. In some embodiments, the super via structure SV1 and the super via structure SV2 may be connected with the same third conductive layer M3, and the first conductive layer M1 connected with the super via structure SV1 may be electrically connected with the fifth conductive layer M5 via the super via structure SV1, the third conductive layer M3, and the super via structure SV2 accordingly. In other words, the super via structures located at different levels may be used to form the required electrical connections in the interconnection structure according to some design considerations.

To summarize the above descriptions, according to the interconnection structure and the manufacturing method thereof in the present invention, the block layer may be disposed in the second interconnection level, and the super via structure configured to connect the first conductive layer in the first interconnection level and the third conductive layer in the third interconnection level may penetrate through the block layer and the second interconnection level. The block layer may be used to improve negative influence of alignment deviations in the process of forming the super via structure, and related process window, manufacturing yield, and/or reliability of the super via structure and the interconnection structure may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method of an interconnection structure, comprising:
   forming a second interconnection level on a first interconnection level, wherein the first interconnection level comprises a first dielectric layer and at least one first conductive layer disposed in the first dielectric layer, and the second interconnection level comprises:
      a second dielectric layer;
      at least one second conductive layer disposed in the second dielectric layer; and
      at least one block layer disposed in the second dielectric layer, wherein a bottom surface of the at least one block layer is lower than a top surface of the at least one second conductive layer in a vertical direction; and forming a third interconnection level and a super via structure, wherein the third interconnection level is formed on the second interconnection level, and the third interconnection level comprises a third dielectric layer and at least one third conductive layer disposed in the third dielectric layer, wherein the at least one block layer is disposed between the at least one third conductive layer and the at least one first conductive layer in the vertical direction, and the super via structure penetrates through the at least one block layer and the second interconnection level in the vertical direction and electrically connects the at least one first conductive layer and the at least one third conductive layer, wherein the bottom surface of the at least one block layer is higher than a bottom surface of the at least one second conductive layer in the vertical direction.

2. The manufacturing method of the interconnection structure according to claim 1, wherein a method of forming the at least one block layer comprise:

forming a recess in the second dielectric layer;

forming a block material on the second dielectric layer, wherein a portion of the block material is formed in the recess and another portion of the block material is formed outside the recess; and performing a planarization process, wherein the block material located outside the recess is removed by the planarization process, and the block material remaining after the planarization process becomes the at least one block layer.

3. The manufacturing method of the interconnection structure according to claim 2, wherein a method of forming the at least one second conductive layer comprises:

forming a trench in the second dielectric layer after the block material is formed; and forming a conductive material before the planarization process, wherein a portion of the conductive material is formed in the trench and another portion of the conductive material is formed outside the trench, and the conductive material located outside the trench is removed by the planarization process.

4. The manufacturing method of the interconnection structure according to claim 3, wherein the trench is directly connected with the recess.

5. The manufacturing method of the interconnection structure according to claim 3, wherein a part of the block material located above the recess in the vertical direction is removed by a process of forming the trench.

6. The manufacturing method of the interconnection structure according to claim 1, wherein a top surface of the at least one block layer and the top surface of the at least one second conductive layer are coplanar.

7. The manufacturing method of the interconnection structure according to claim 1, wherein the super via structure directly contacts the at least one block layer.

8. The manufacturing method of the interconnection structure according to claim 1, wherein the second interconnection level comprises two second conductive layers disposed in the second dielectric layer and located adjacent to each other in a horizontal direction, and the at least one block layer is disposed between the two second conductive layers in the horizontal direction and directly connected with the two second conductive layers.

9. The manufacturing method of the interconnection structure according to claim 1, wherein the second interconnection level further comprises an etching stop layer disposed between the second dielectric layer and the first interconnection level in the vertical direction, wherein a first portion of the super via structure penetrates through the etching stop layer, a second portion of the super via structure penetrates through the third dielectric layer located between the at least one third conductive layer and the second interconnection level in the vertical direction, and the first portion of the super via structure is directly connected with the second portion of the super via structure.

* * * * *